(12) United States Patent
Cho et al.

(10) Patent No.: US 10,658,975 B2
(45) Date of Patent: *May 19, 2020

(54) SEMICONDUCTOR DEVICE AND METHOD

(71) Applicant: Taiwan Semiconductor Manufacturing Company, Ltd., Hsinchu (TW)

(72) Inventors: Lan-Chou Cho, Hsinchu (TW); Huan-Neng Chen, Taichung (TW); Chewn-Pu Jou, Hsinchu (TW); Feng Wei Kuo, Zhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/376,519

(22) Filed: Apr. 5, 2019

(65) Prior Publication Data

US 2019/0229677 A1 Jul. 25, 2019

Related U.S. Application Data

(60) Division of application No. 15/599,694, filed on May 19, 2017, now Pat. No. 10,270,389, which is a (Continued)

(51) Int. Cl.
*H03B 5/12* (2006.01)
*H03L 7/00* (2006.01)
(Continued)

(52) U.S. Cl.
CPC ............ *H03B 5/1243* (2013.01); *H01F 5/04* (2013.01); *H01F 19/04* (2013.01);
(Continued)

(58) Field of Classification Search
CPC .. H03B 5/1212; H03B 5/1228; H03B 5/1243; H03B 5/1256; H03B 5/1265; H03B 5/1296; H03J 2200/10
See application file for complete search history.

(56) References Cited

U.S. PATENT DOCUMENTS

| 1,378,187 A | 5/1921 | Northrup |
| 4,868,525 A | 9/1989 | Dias |

(Continued)

FOREIGN PATENT DOCUMENTS

| CN | 1950913 A | 4/2007 |
| CN | 102132362 A | 7/2011 |

(Continued)

OTHER PUBLICATIONS

Chen, M., "Understanding and Designing Differential Filters for Communications Systems," Analog Devices, Inc., Technical Article, 6 pages.

*Primary Examiner* — Levi Gannon
(74) *Attorney, Agent, or Firm* — Slater Matsil, LLP

(57) ABSTRACT

A circuit includes a first digital controlled oscillator and a second digital controlled oscillator coupled to the first digital controlled oscillator. A skew detector is connected to determine a skew between outputs of the first digital controlled oscillator and the second digital controlled oscillator, and a decoder is utilized to output a control signal, based on the skew, to modify a frequency of the first digital controlled oscillator using a switched capacitor array to reduce or eliminate the skew.

20 Claims, 25 Drawing Sheets

US 10,658,975 B2
Page 2

Related U.S. Application Data continuation-in-part of application No. 15/295,298, filed on Oct. 17, 2016, now Pat. No. 9,866,173, which is a continuation of application No. 14/319,787, filed on Jun. 30, 2014, now Pat. No. 9,473,152, which is a continuation-in-part of application No. 14/075,021, filed on Nov. 8, 2013, now Pat. No. 9,191,014.

(51) Int. Cl.
*H01F 27/28* (2006.01)
*H01F 5/04* (2006.01)
*H01F 38/14* (2006.01)
*H01F 19/04* (2006.01)
*H03L 7/099* (2006.01)

(52) U.S. Cl.
CPC ....... *H01F 27/2804* (2013.01); *H01F 27/288* (2013.01); *H01F 27/2871* (2013.01); *H01F 38/14* (2013.01); *H03B 5/1212* (2013.01); *H03B 5/1228* (2013.01); *H03B 5/1256* (2013.01); *H03B 5/1265* (2013.01); *H03B 5/1296* (2013.01); *H03L 7/00* (2013.01); *H03L 7/099* (2013.01); *H03L 7/0995* (2013.01); *H03J 2200/10* (2013.01)

(56) References Cited

U.S. PATENT DOCUMENTS

| | | | |
|---|---|---|---|
| 5,239,274 A | 8/1993 | Chi | |
| 5,357,217 A | 10/1994 | Marchesi et al. | |
| 5,523,720 A * | 6/1996 | Omoto | H03B 5/1847 329/318 |
| 5,717,343 A | 2/1998 | Kwong | |
| 5,920,235 A * | 7/1999 | Beards | H03B 5/1243 331/108 D |
| 6,028,488 A | 2/2000 | Landman et al. | |
| 6,346,837 B1 | 2/2002 | Shibayama | |
| 6,639,481 B1 | 10/2003 | Ravi et al. | |
| 6,750,726 B1 * | 6/2004 | Hung | H03B 5/1228 331/100 |
| 6,891,444 B2 | 5/2005 | Jacobsson et al. | |
| 7,151,430 B2 | 12/2006 | Mattsson | |
| 7,173,498 B2 | 2/2007 | Ramaswamy et al. | |
| 7,250,826 B2 * | 7/2007 | Gabara | H03B 5/1841 331/117 FE |
| 7,362,194 B2 * | 4/2008 | Komurasaki | H03B 5/1847 331/116 M |
| 7,423,495 B2 | 9/2008 | Bevilacqua et al. | |
| 7,551,038 B2 | 6/2009 | Jang et al. | |
| 7,633,352 B2 | 12/2009 | El Rai | |
| 7,847,650 B2 | 12/2010 | Yao et al. | |
| 8,058,934 B2 | 11/2011 | Rangarajan et al. | |
| 8,138,845 B1 | 3/2012 | Zhang et al. | |
| 8,174,288 B2 | 5/2012 | Dennard et al. | |
| 8,258,907 B2 | 9/2012 | Hansen | |
| 8,305,151 B2 | 11/2012 | Tanabe | |
| 8,476,972 B2 | 7/2013 | Wang et al. | |
| 8,531,250 B1 | 9/2013 | Luschas | |
| 8,570,107 B2 | 10/2013 | Guo et al. | |
| 8,593,232 B2 | 11/2013 | Chataigner | |
| 8,638,175 B2 | 1/2014 | Dubey | |
| 8,841,983 B2 | 9/2014 | Newton et al. | |
| 9,018,987 B1 | 4/2015 | Lahiri | |
| 9,281,826 B2 | 3/2016 | Fujiwara et al. | |
| 9,401,696 B1 | 7/2016 | Ferriss et al. | |
| 9,673,790 B2 | 6/2017 | Jou et al. | |
| 10,153,727 B2 * | 12/2018 | Anand | H03B 5/1228 |
| 2002/0003452 A1 | 1/2002 | Mizuno et al. | |
| 2002/0040991 A1 | 4/2002 | Embabi et al. | |
| 2003/0001680 A1 | 1/2003 | Knecht et al. | |
| 2004/0227608 A1 | 11/2004 | Nakatani et al. | |
| 2006/0001496 A1 | 1/2006 | Abrosimov et al. | |
| 2006/0181362 A1 * | 8/2006 | Ikuta | H03B 5/1841 331/167 |
| 2007/0247237 A1 | 10/2007 | Mohammadi | |
| 2007/0268007 A1 | 11/2007 | El Rai | |
| 2008/0252387 A1 | 10/2008 | Higashi | |
| 2008/0309423 A1 | 12/2008 | Itoh et al. | |
| 2009/0261911 A1 | 10/2009 | Watanabe et al. | |
| 2009/0289727 A1 | 11/2009 | El Rai | |
| 2009/0302958 A1 | 12/2009 | Sakurai et al. | |
| 2010/0085123 A1 | 4/2010 | Frans et al. | |
| 2010/0176889 A1 | 7/2010 | Nix et al. | |
| 2010/0225407 A1 | 9/2010 | Goyal et al. | |
| 2010/0253382 A1 | 10/2010 | Wang et al. | |
| 2010/0295625 A1 | 11/2010 | Tanabe | |
| 2011/0050354 A1 | 3/2011 | Hirashiki et al. | |
| 2011/0076979 A1 | 3/2011 | Wu et al. | |
| 2011/0102093 A1 | 5/2011 | El Rai et al. | |
| 2011/0148535 A1 | 6/2011 | Lee | |
| 2011/0148536 A1 | 6/2011 | Italia et al. | |
| 2012/0039366 A1 | 2/2012 | Wood et al. | |
| 2012/0262238 A1 | 10/2012 | Dong et al. | |
| 2012/0286879 A1 | 11/2012 | Nylen | |
| 2013/0082790 A1 | 4/2013 | Trivedi et al. | |
| 2013/0147566 A1 * | 6/2013 | Voinigescu | H03B 5/1231 331/117 FE |
| 2013/0194047 A1 | 8/2013 | Tomita et al. | |
| 2014/0203881 A1 * | 7/2014 | Lu | H03B 1/00 331/117 FE |
| 2014/0218120 A1 | 8/2014 | Hekmat et al. | |
| 2014/0266481 A1 * | 9/2014 | Shanan | H03B 5/1265 331/117 FE |
| 2014/0368285 A1 * | 12/2014 | Lu | H03B 5/1228 331/117 FE |
| 2015/0340872 A1 | 11/2015 | Franzon et al. | |
| 2016/0141092 A1 | 5/2016 | Ellinger et al. | |
| 2017/0257064 A1 | 9/2017 | Cho et al. | |

FOREIGN PATENT DOCUMENTS

| | | |
|---|---|---|
| KR | 20040016907 A | 2/2004 |
| KR | 20060078600 A | 7/2006 |
| TW | 1406306 B | 8/2013 |

* cited by examiner

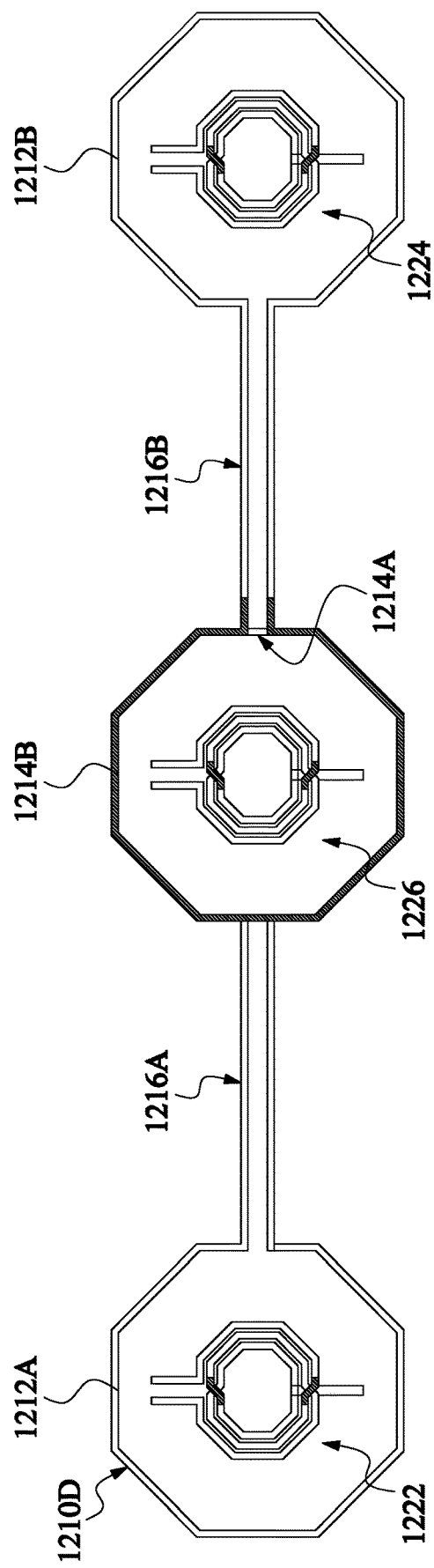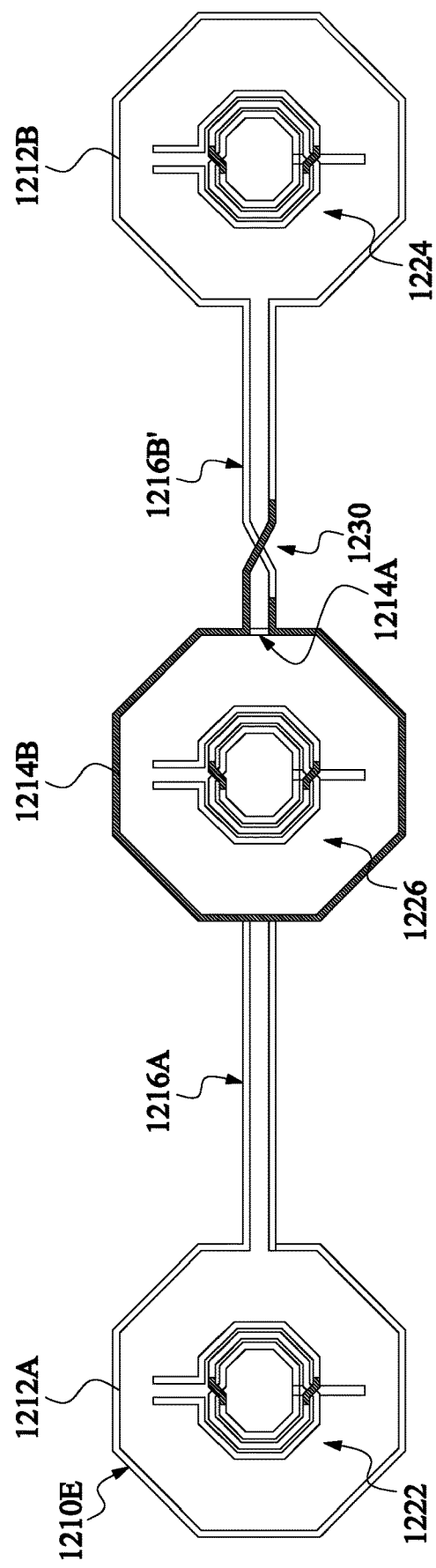
Fig. 12D
Fig. 12E

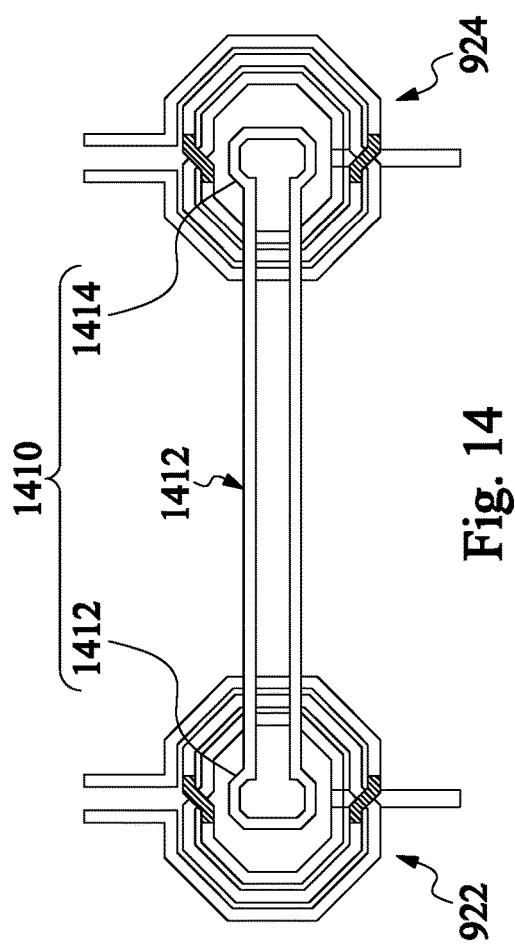
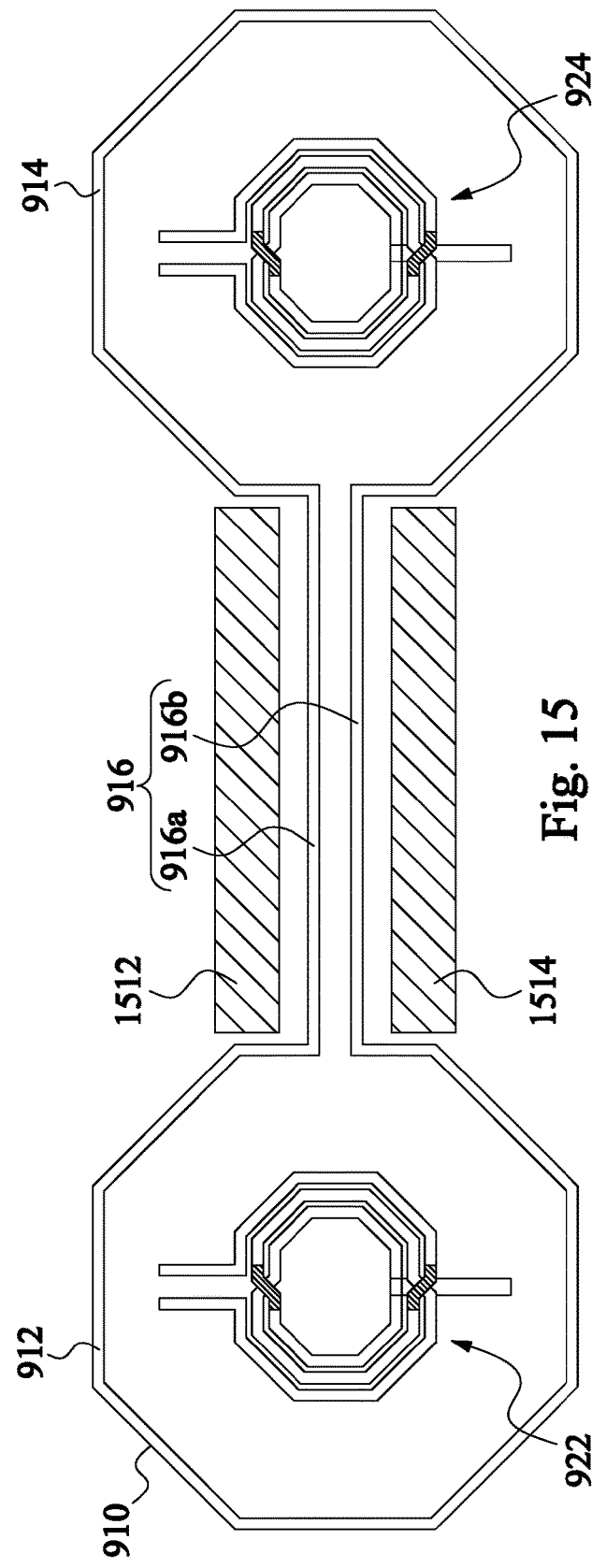

SEMICONDUCTOR DEVICE AND METHOD

PRIORITY CLAIM AND CROSS-REFERENCE

This application is a divisional of U.S. patent application Ser. No. 15/599,694, entitled "Semiconductor Device and Method," filed on May 19, 2017, which application is a continuation-in-part of U.S. patent application Ser. No. 15/295,298, entitled "Coupling Structure for Inductive Device, filed on Oct. 17, 2016 (now U.S. Pat. No. 9,866,173, issued on Jan. 9, 2018), which application is a continuation of U.S. patent application Ser. No. 14/319,787, entitled "Coupling Structure for Inductive Device," filed on Jun. 30, 2014 (now U.S. Pat. No. 9,473,152, issued on Oct. 18, 2016), which application is a continuation-in-part of U.S. patent application Ser. No. 14/075,021, entitled "Method and Apparatus of Synchronizing Oscillators," filed on Nov. 8, 2013 (now U.S. Pat. No. 9,191,014 issued on Nov. 17, 2015), which applications are incorporated herein by reference.

BACKGROUND

In an integrated circuit, a clock tree is generally used for distributing a common clock signal to various components in order to synchronize the operation thereof. Differences in the arrival time of the clock signals at two or more clocked components of the integrated circuit can result in errors in the operation of the integrated circuit. In some applications, the clock tree for the distribution of the common clock signal includes structures such as H-tree meshes or balanced buffer trees. In many cases, mismatch of the arrival of the distributed clock signals is minimized at the cost of sufficient driving current for distributing the common clock signal along the clock tree. With the increase of the frequency of the clock signal, power consumption for driving the clock tree increases. Also, clock buffers at various stages of the clock trees usually draw huge currents from a power supply grid, and thus affect the performance of nearby components by causing voltage drops of the supply voltage. In some applications, clock trees use 20% to 40% of total power consumption of the integrated circuits.

BRIEF DESCRIPTION OF THE DRAWINGS

One or more embodiments are illustrated by way of example, and not by limitation, in the figures of the accompanying drawings, wherein elements having the same reference numeral designations represent like elements throughout.

FIGS. 12A-E are top views of coupling structures and corresponding inductive devices in accordance with one or more embodiments.

FIG. 14 is a top view of a coupling structure and corresponding inductive devices in accordance with one or more embodiments.

FIG. 15 is a top view of a coupling structure with shielding structures and corresponding inductive devices in accordance with one or more embodiments.

DETAILED DESCRIPTION

Figure 1:
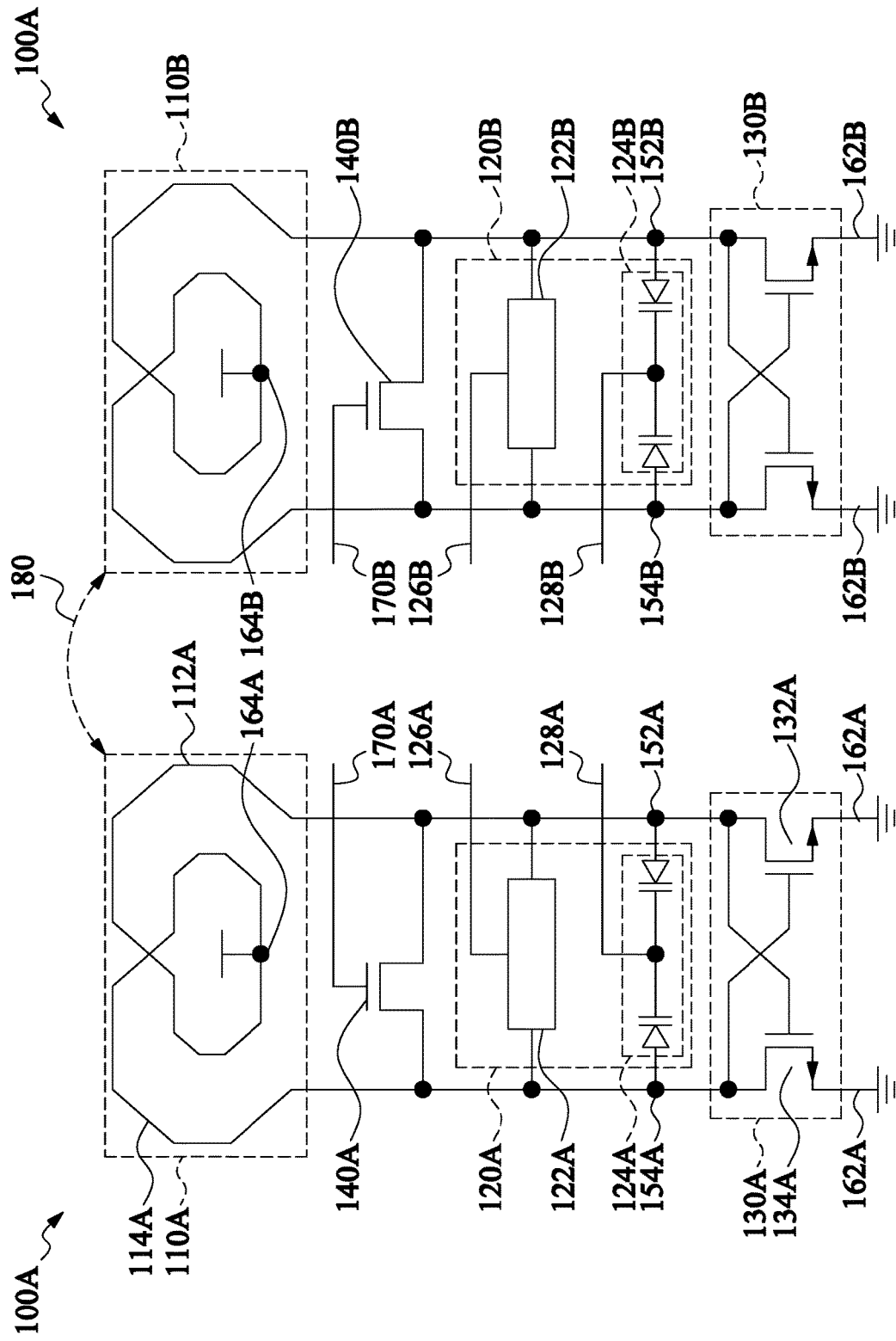
FIG. 1 is a schematic diagram of two oscillators in accordance with one or more embodiments.

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

In some embodiments, two or more oscillators configured to generated output oscillating signals having a predetermined frequency, instead of using a clock tree, is utilized to distribute a clock signals to various clocked components in an integrated circuit. Furthermore, one or more synchronization mechanisms are implemented to minimize frequency or phase differences among the oscillating signals generated by the two or more oscillators. In some embodiments, the one or more synchronization mechanisms include magnetic coupling, master-slave fine-tuning, and pulse injection.

FIG. 1 is a schematic diagram of two oscillators 100A and 100B in accordance with one or more embodiments. In some embodiments, oscillators 100A and 100B are configured to generate oscillating signals having a predetermined frequency. In some embodiments, frequencies of oscillating signals from oscillators 100A and 100B are approximately the same but not exactly equal to the predetermined frequency. Also, in some embodiments, phases of oscillating signals from oscillators 100A and 100B are not exactly synchronized. In some embodiments, synchronizing oscillators 100A and 100B refers to minimizing the frequency or phase differences between the oscillating signals from oscillators 100A and 100B. Although only two oscillators 100A and 100B are illustrated in conjunction with FIG. 1, the synchronization mechanisms illustrated in this disclosure are applicable to two or more similarly configured oscillators of a same integrated circuit.

Oscillator 100A includes an inductive device 110A, a capacitive device 120A, an active feedback device 130A, a switch device 140A, an output node 152A, and a complementary output node 154A. Inductive device 110A, capacitive device 120A, active feedback device 130A, and switch device 140A are coupled between output node 152A and complementary output node 152B.

Active feedback device 130A includes two N-type transistors 132A and 134A. Source terminals of transistors 132A and 134A are coupled with ground reference node 162A. A drain terminal of transistor 132A is coupled with node 152A and a gate terminal of transistor 134A, and a drain terminal of transistor 134A is coupled with node 154A and a gate terminal of transistor 132A. Active feedback device 130A is configured to output a first output oscillating signal at node 152A and a first complementary output oscillating signal at node 154A. The first output oscillating signal and the first complementary output oscillating signal have the predetermined frequency determined according to electrical characteristics of inductive device 110A and electrical characteristics of the capacitive device 120A. In some embodiments, if inductive device 110A has a inductance of $L_{TOTAL}$ and capacitive device 120A has a capacitance of $C_{TOTAL}$, the predetermined frequency $F_{OSC}$ (in Hz) is determinable according to the following equation:

$$F_{OSC} = \frac{1}{2\pi\sqrt{L_{TOTAL}C_{TOTAL}}}$$

In some applications, oscillators having configurations similar to oscillator 100A are also known as "LC tank oscillators." In some embodiments, transistors 132A and 134A are P-type transistors. In some embodiments, other types of active feedback devices are also usable as active feedback device 130A.

Inductive device 110A includes inductor 112A and inductor 114A integratedly formed as a conductive coil. Inductor 112A is coupled between node 152A and a supply reference node 164A, and inductor 114A is coupled between node 154A and supply reference node 164A.

Capacitive device 120A includes a coarse-tuning capacitor 122A and a fine-tuning capacitor 124A. In some embodiments, capacitance of coarse-tuning capacitor 122A is set according to a set of digital signals from bus 126A. In some embodiments, a coarse-tuning capacitor 122A is replaced by a set of hard-wired capacitors, and thus capacitance of coarse-tuning capacitor 122A is fixed and bus 126A is thus omitted. In some embodiments, capacitance of fine-tuning capacitor 124A is set according to an analog signal from path 128A. In some embodiments, a resonant frequency of oscillator 100A is adjustable by controlling coarse-tuning capacitor 122A or fine-tuning capacitor 124A.

Switch device 140A is configured to set signals at nodes 152A and 154A at corresponding predetermined voltage levels when switch device 140A is turned on. For example, when switch device 140A is turned on, node 152A and 154A are electrically coupled together. Under this circumstance, transistors 132A and 134A and inductors 112A and 114A function as a voltage divider, and signals at node 152A and 154A are set at a voltage level determinable according to impedance of transistors 132A and 134A and inductors 112A and 114A. In some embodiments, when switch device 140A is turned on, signals at node 152A and 154A are set at about the middle of voltage levels of the supply reference node 164A and ground reference node 162A.

Switches device 140A is controlled by a signal on path 170A. In some embodiments, the control signal on path 170A is a pulse signal used to force the crossing-over of oscillating signals at node 152A and 154A. Therefore, in the present application, switch device 140A is also referred to as a reset device or a pulse-injection device. In some embodiments, switch device 140A is a transistor. In some embodiments, switch device 140A is a P-type transistor, an N-type transistor, or a transmission gate. In some embodiments, switch device 140A is omitted.

Oscillator 100B includes an inductive device 110B, a capacitive device 120B, an active feedback device 130B, a switch device 140B, an output node 152B, and a complementary output node 154B. Oscillator 100B and Oscillator 100A have substantially the same configuration. Components of oscillator 100B similar to those of oscillator 100A are given similar reference numbers, except the corresponding suffixes are changed from 'A' to 'B'. Features and functions of oscillator 100B are substantially similar to those advanced above with regard to oscillator 100A, and detailed description regarding oscillator 100B is thus not repeated.

In some embodiments, oscillator 100A and oscillator 100B are on a same substrate, different substrates on a same package substrate, different substrates of a stack of substrates, or different substrates of a stack of dies. In some embodiments, a power distribution network is implemented to cause supply reference nodes 164A and 164B to have substantially a same supply voltage level, and to cause ground reference nodes 162A and 162B to have substantially a same ground reference level. In some embodiments, digital signals on buses 126A and 126B have the same logic values.

In some embodiments, signals on path 170A and path 170B are provided by a signal distribution network based on a common signal. In some embodiments, signals on path 170A and path 170B are synchronized signals. In some embodiments, signals on path 170A and path 170B are pulse signals. In some embodiments, the predetermined frequency of output oscillating signals of oscillators 100A and 100B is an integer multiple of a frequency of signals on path 170A and path 170B.

Furthermore, inductive device 110A of oscillator 100A and inductive device 110B of oscillator 100B are magnetically coupled (as depicted by dotted arrow 180). Magnetic coupling between inductive device 110A and inductive device 110B refers to that magnetic flux generated by operating inductive device 110A affects operation of inductive device 110B, and vice versa. Similar to the location where oscillators 100A and 100B are disposed, in some embodiments, inductive device 110A and inductive device 110B are on a same substrate, different substrates on a same package substrate, different substrates of a stack of substrates, or different substrates of a stack of dies. Inductive device 110A and inductive device 110B are configured to attenuate out-of-phase components and enhance in-phase component of oscillating signals at node 152A of oscillator 100A and node 152B of oscillator 100B. As a result, after oscillator 100A and oscillator 100B are enabled, output oscillating signals at nodes 152A and 152B are eventually stabilized to be in-phase oscillating signals. In other words, inductive device 110A and inductive device 110B are configured to synchronize oscillating signals generated by oscillator 100A and oscillator 100B.

In some embodiments, inductive device 110A of oscillator 100A and inductive device 110B of oscillator 100B have a distance equal to or less than a predetermined distance in order to cause mutual-inductance sufficient to synchronize oscillator 100A and oscillator 100B within a predetermined period of time. In some embodiments, the predetermined distance is one half of a wavelength of an electromagnetic wave having the predetermined frequency of oscillating signals. In some embodiments, the predetermined frequency of output oscillating signals ranges from 100 MHz to 20 GHz.

Figure 2B:
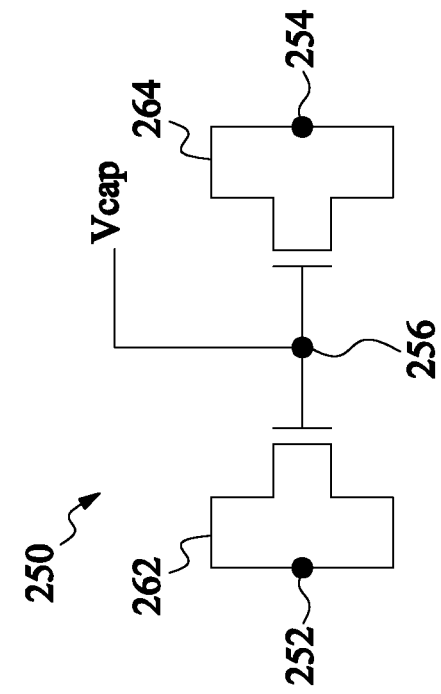
FIG. 2B is a schematic diagram of a varactor usable in one or both of the oscillators in FIG. 1 in accordance with one or more embodiments.
Figure 2A:
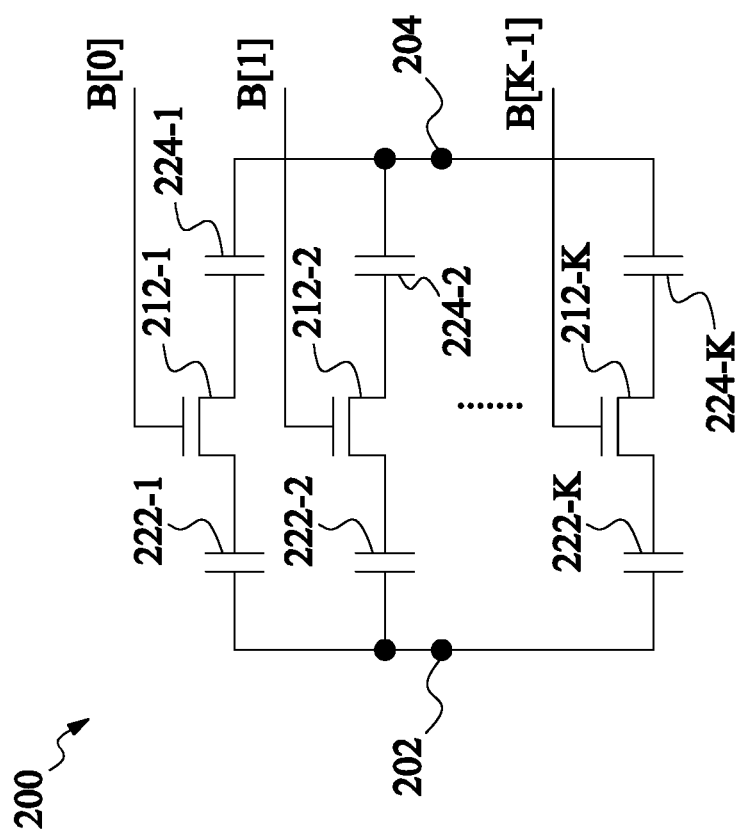
FIG. 2A is a schematic diagram of a capacitor array usable in one or both of the oscillators in FIG. 1 in accordance with one or more embodiments.

FIG. 2A is a schematic diagram of a capacitor array 200 usable as coarse-tuning capacitor 122A or coarse-tuning capacitor 122B in accordance with one or more embodiments. Capacitor array 200 includes a first node 202, a second node 204, K transistors 212-1 to 212-K, and 2K capacitors 222-1 to 222-K and 224-1 to 224-K, where K is a positive integer. First node 202 and second node 204 are usable to be connected with the corresponding node 152A or node 154A, or to be connected with the corresponding node 152B or node 154B. Capacitors 222-1 to 222-K are coupled to first node 202, capacitors 224-1 to 224-K are coupled to second node 204, and transistors 212-1 to 212-K are coupled between corresponding pairs of capacitors 222-1 to 222-K and 224-1 to 224-K. Transistors 212-1 to 212-K function as switches and controlled by control signals B[0], B[1], to B[K−1].

In some embodiments, transistors 212-1 to 212-K are P-type transistors or N-type transistors. In some embodiments, transistors 212-1 to 212-K are replaced by transmission gates or other types of switches. In some embodiments, capacitors 222-1 to 222-K and 224-1 to 224-K are metal-oxide-metal capacitors or metal-insulator-metal capacitors.

In some embodiments, total capacitance of each path, including one of transistors 212-1 to 212-K, a corresponding capacitor of capacitors 222-1 to 222-K, and a corresponding capacitor of capacitors 224-1 to 224-K, has a same value. Under these circumstances, control signals B [0:K−1] are coded in a unary coding format. In some embodiments, total capacitance of each path as defined above corresponds to one of $2^0$, $2^1$, ... $2^{K-1}$ times of a predetermined unit capacitance value. Under these alternative circumstances, control signals B[0:K−1] are coded in a binary coding format.

FIG. 2B is a schematic diagram of a varactor 250 usable as fine-tuning capacitor 124A or fine-tuning capacitor 124B in FIG. 1 in accordance with one or more embodiments. Varactor 250 includes a first node 252, a second node 254, a control node 256, and transistors 262 and 264. First node 252 and second node 254 are usable to be coupled with a corresponding node 152A or node 154A, or to be coupled with a corresponding node 152B or node 154B. Transistor 262 has a drain terminal and a source terminal coupled together with first node 252. Transistor 262 has a gate terminal coupled to the control node 256. Transistor 264 has a drain terminal and a source terminal coupled together with second node 254. Transistor 264 has a gate terminal coupled to the control node 256. Control node 256 is configured to receive an analog control signal $V_{CAP}$, such as a control signal on path 128A or 128B. A total capacitance between nodes 252 and 254 is adjustable responsive to a voltage level of control signal $V_{CAP}$. In some embodiments, transistors 262 and 264 are P-type transistors or N-type transistors.

In FIG. 1, only two oscillators 100A and 100B are depicted. However, in some embodiments, there are more than two oscillators for generating clocks in an integrated circuit. Also, the inductive device 110A or 110B of an oscillator 100A or 100B is capable of magnetically coupled with more than two inductive devices of two or more oscillators.

Figure 3:
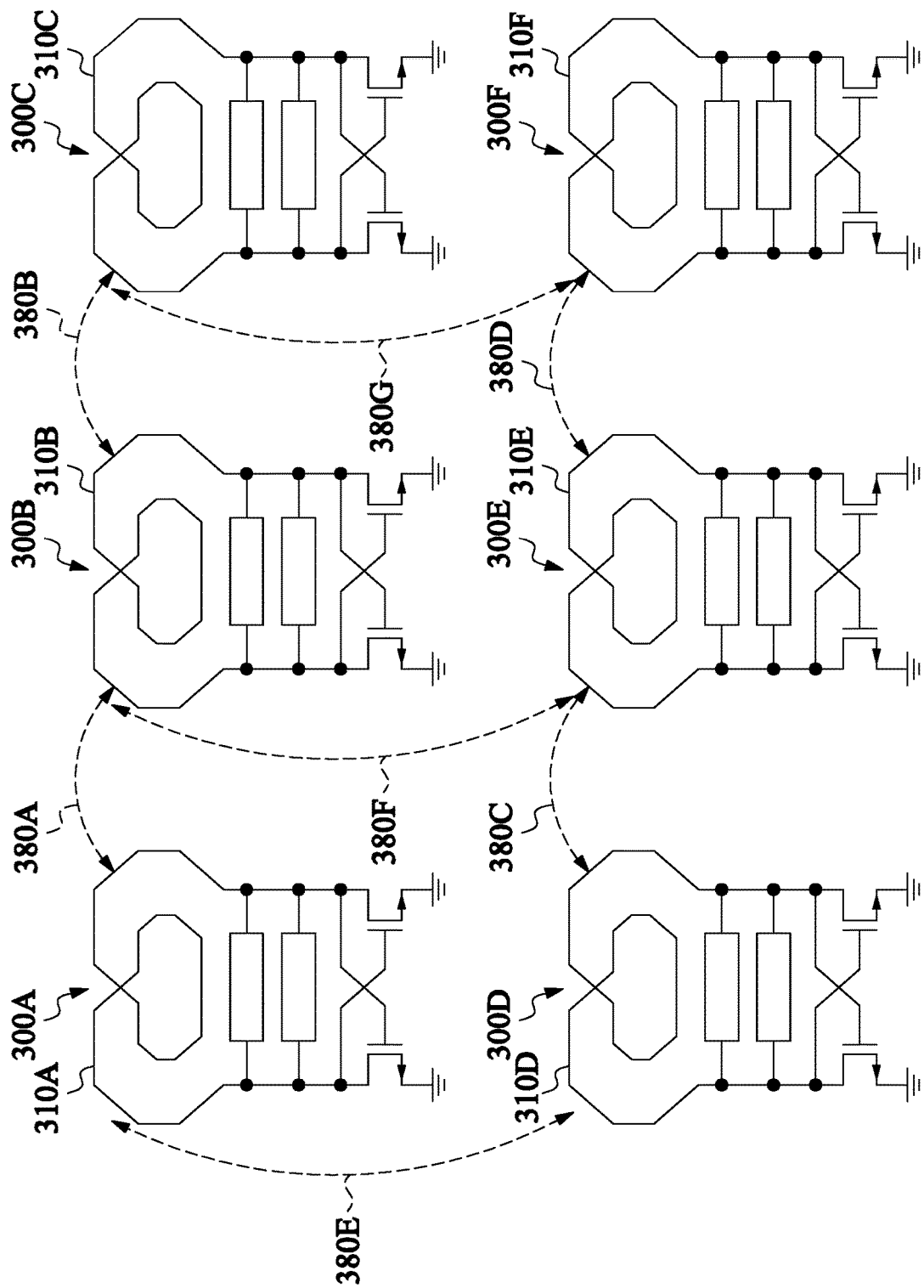
FIG. 3 is a schematic diagram of six oscillators in accordance with one or more embodiments.

For example, FIG. 3 is a schematic diagram of six oscillators 300A to 300F in accordance with one or more embodiments. Oscillators 300A to 300F have a configuration similar to oscillator 100A described above. Among other things, oscillators 300A to 300F have corresponding inductive devices 310A to 310F. Other details of oscillators 300A to 300F are omitted.

As depicted in FIG. 3, inductive devices 310A and 310B are magnetically coupled (dotted arrow 380A); inductive devices 310B and 310C are magnetically coupled (dotted arrow 380B); inductive devices 310D and 310E are magnetically coupled (dotted arrow 380C); inductive devices 310E and 310F are magnetically coupled (dotted arrow 380D); inductive devices 310A and 310D are magnetically coupled (dotted arrow 380E); inductive devices 310B and 310E are magnetically coupled (dotted arrow 380F); and inductive devices 310C and 310F are magnetically coupled (dotted arrow 380G). In this embodiment, mutual-inductive coupling 380A to 380G are configured to cause oscillators 300A to 300F to generate oscillating signals having approximately a same predetermined frequency and approximately the same phase.

In some embodiments, inductive devices 310A to 310F are formed on a same substrate, different substrates on a same package substrate, different substrates of a stack of substrates, or different substrates of a stack of dies. In some embodiments, distances between two of inductive devices 310A to 310F that corresponds to one of magnetic coupling 380A to 380G is equal to or less than one half of a wavelength of an electromagnetic wave having the predetermined frequency. In some embodiments, the predetermined frequency of output oscillating signals ranges from 100 MHz to 20 GHz.

Figure 4:
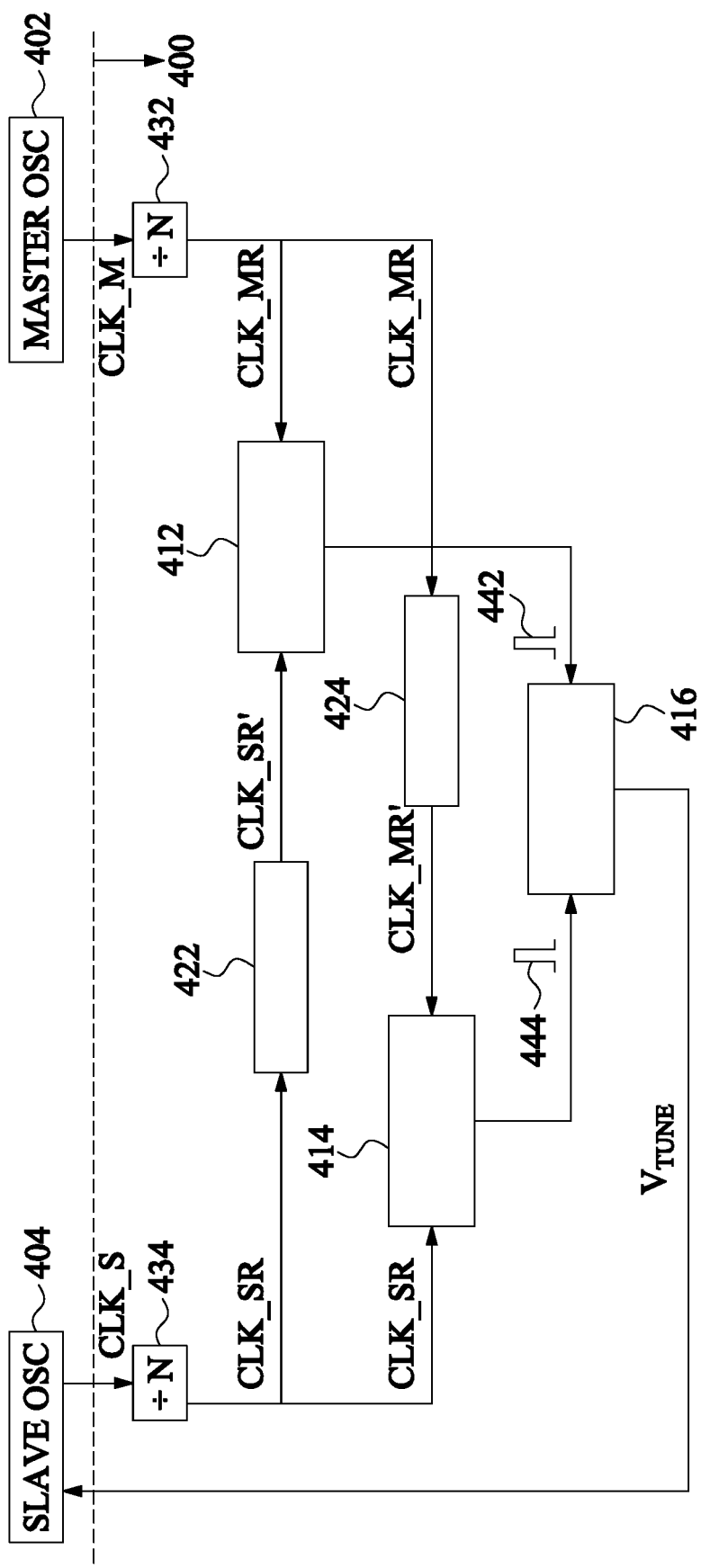
FIG. 4 is a functional block diagram of a set of master-slave fine-tuning unit in accordance with one or more embodiments.

FIG. 4 is a functional block diagram of a set of master-slave fine-tuning unit 400 in accordance with one or more embodiments. The set of master-slave fine-tuning unit 400 is coupled to a mater oscillator 402 and a slave oscillator 404 and is capable of controlling a resonant frequency of slave oscillator 404 based on comparing output oscillating signals of master oscillator 402 and the slave oscillator 404. In some embodiments, master oscillator 402 corresponds to oscillator 100B in FIG. 1, slave oscillator 404 corresponds to oscillator 100A, and resonant frequency of slave oscillator 404 is adjustable by controlling fine-tuning capacitor 124A.

The set of master-slave fine-tuning unit 400 includes a first phase comparator 412, a second phase comparator 414, a control unit 416, a first conductive path 422, a second conductive path 424, a first frequency divider 432, and a second frequency divider 434.

First frequency divider 432 is disposed adjacent to and electrically coupled to master oscillator 402. First frequency divider 432 is configured to receive an output oscillating signal CLK_M from master oscillator 402 and to generate a reference signal CLK_MR by frequency-dividing the output oscillating signal CLK_M by a predetermined ratio N. In some embodiments, N is a positive integer. In some embodiments, N ranges from 4 to 16. Second frequency divider 434 is disposed adjacent to and electrically coupled to slave oscillator 402. Second frequency divider 434 is configured to receive an output oscillating signal CLK_S from slave oscillator 404 and to generate a reference signal CLK_SR by frequency-dividing the output oscillating signal CLK_S by the predetermined ratio N.

In some embodiments, first frequency divider 432 and second frequency divider 434 are omitted, and oscillating signals CLK_M and CLK_S are used as reference signal CLK_MR and reference signal CLK_SR.

First phase comparator 412 is disposed adjacent to the master oscillator 402. Second phase comparator 414 is disposed adjacent to the slave oscillator 404. First conductive path 422 and second conductive path 424 are disposed between master oscillator 402 and slave oscillator 404. First phase comparator 412 is configured to generate a first phase error signal 442 according to reference signal CLK_MR from master oscillator 402 and a delayed version CLK_SR' of reference signal CLK_SR from the slave oscillator 404 transmitted through first conductive path 422. Second phase comparator 422 is configured to generate a second phase error signal 444 according to reference signal CLK_SR from slave oscillator 404 and a delayed version CLK_MR' of reference signal CLK_MR from the master oscillator 402 transmitted through the second conductive path 424.

Control unit 416 is configured to generate a tuning signal $V_{TUNE}$ to slave oscillator 404 according to first phase error signal 442 and second phase error signal 444. In some embodiments, tuning signal $V_{TUNE}$ is usable as analog control signal $V_{CAP}$ of FIG. 2B or as analog control signal for adjusting fine-tuning capacitor 124A carried by path 128A of FIG. 1.

Figure 5:
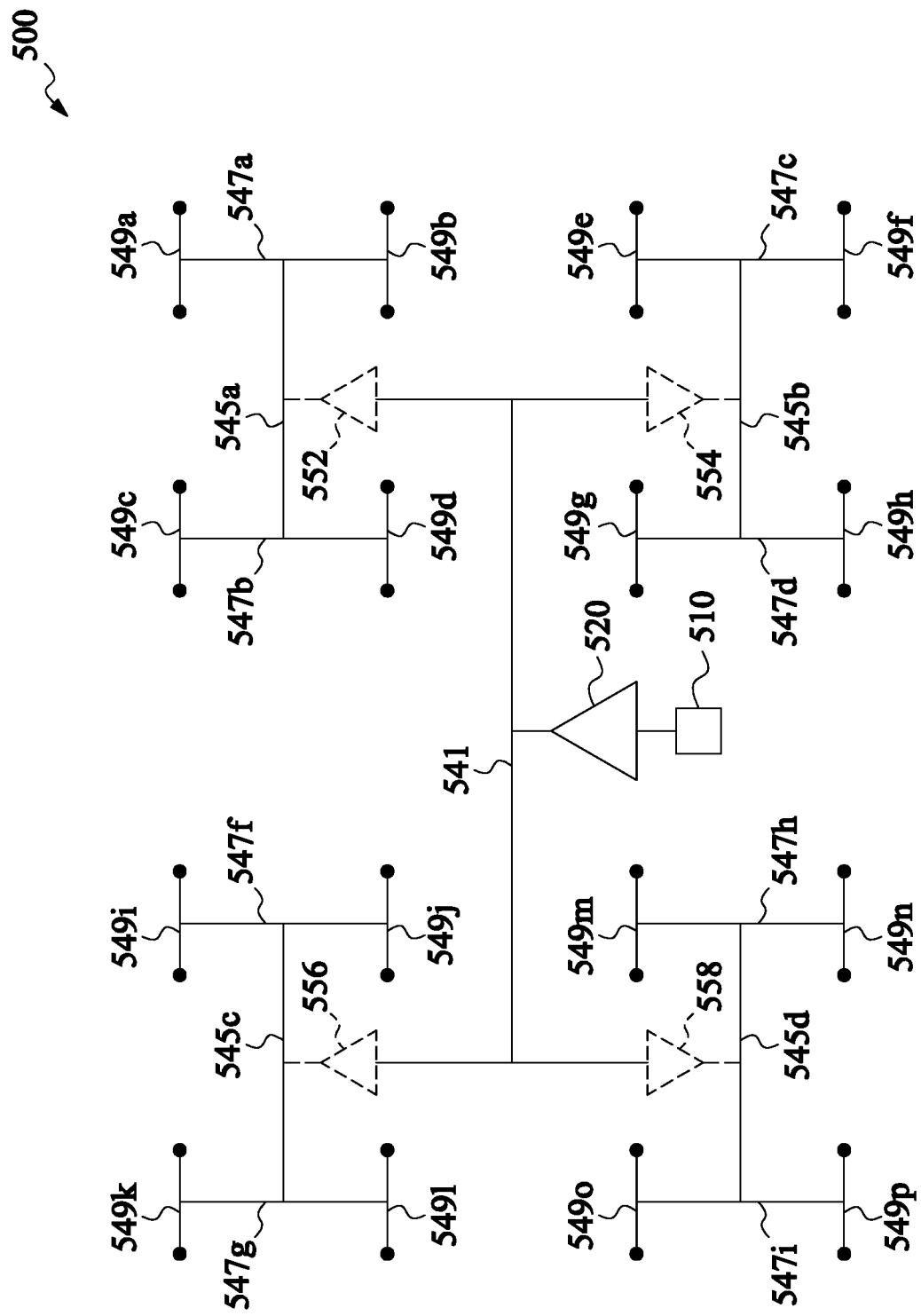
FIG. 5 is a schematic diagram of a pulse distribution network in accordance with one or more embodiments.

FIG. 5 is a schematic diagram of a pulse distribution network 500 in accordance with one or more embodiments. In some embodiments, pulse distribution network 500 is usable to provide a control signal to switch device 140A of oscillator 100A through path 170A and a control signal to switch device 140B of oscillator 100B through path 170B.

Pulse distribution network 500 includes a pulse generator 510, a driver 520, and one or more conductive paths arranged to have an H-tree configuration. Two or more oscillators 532 and 534 are coupled to two of ends of the H-tree. In some embodiments, oscillator 532 corresponds to oscillator 100A in FIG. 1, and oscillator 532 corresponds to oscillator 100B.

Pulse generator 510 is configured to generate a pulse signal usable as control signals for switch devices or reset devices of corresponding oscillators. In some embodiments, the pulse signal has a pulse frequency, and the predetermined frequency of output oscillating signals of oscillators 532 and 534 is an integer multiple of the pulse frequency. The pulse signal is transmitted to oscillators 532 and 534 in order to set output oscillating signals at predetermined voltage levels by corresponding switch devices of the oscillators responsive to the pulse signal. Thus, a timing of rising edges or falling edges of output oscillating signals of oscillators 532 and 534 are synchronized according to the pulse signal.

The H-tree depicted in FIG. 5 is a five-level H-tree including one ($2^0$) first level conductive path 541, two ($2^1$) second level conductive paths 543a and 543b coupled to corresponding ends of path 541, four ($2^3$) third level conductive paths 545a, 545b, 545c, and 545d coupled to corresponding ends of paths 543a or 543b, eight ($2^3$) fourth level conductive paths 547a to 547i coupled to corresponding ends of paths 545a to 545d, and 16 ($2^4$) fifth level conductive paths 549a to 549p coupled to corresponding ends of paths 547a to 547i. Fifth level conductive paths 549a to 549p have ends connected to corresponding switch devices of various oscillators. For example, one end of path 549a is coupled to oscillator 532, and one end of path 549b is coupled to oscillator 534. In some embodiments, each ends of fifth level conductive paths 539a to 539p has a same routing distance. Therefore, conductive paths from driver 520 to corresponding ends of fifth level conductive paths 549a to 549p are configured to impose substantially the same delay to the pulse signal during the transmission and distribution thereof.

Driver 520 is configured to provide sufficient current driving capability to transmit the pulse signal generated by pulse generator 510 to various ends of the fifth level conductive paths 549a to 549p. In some embodiments, additional drivers 552, 554, 556, and 558 are at ends of second level conductive paths 543a and 543b. In some embodiments, additional drivers 552, 554, 556, and 558 are omitted. In some embodiments, additional drivers 552, 554, 556, and 558 are disposed at corresponding ends of a different level of conductive paths in the H-tree.

Therefore, at least three different ways to synchronize output oscillating signals of two or more oscillators, such as oscillators 100A and 100B in FIG. 1, are described above: magnetic coupling (illustrated with reference to FIGS. 1 and 3); master-slave fine-tuning (illustrated with reference to FIG. 4); and pulse injection (illustrated with reference to FIG. 5). In some embodiments, two or more oscillators 100A and 100B are synchronized using magnetic coupling and master-slave fine-tuning mechanisms. In some embodiments, two or more oscillators 100A and 100B are synchronized using magnetic coupling and pulse injection mechanisms. In some embodiments, two or more oscillators 100A and 100B are synchronized using magnetic coupling, master-slave fine-tuning, and pulse injection mechanisms.

Figure 6:
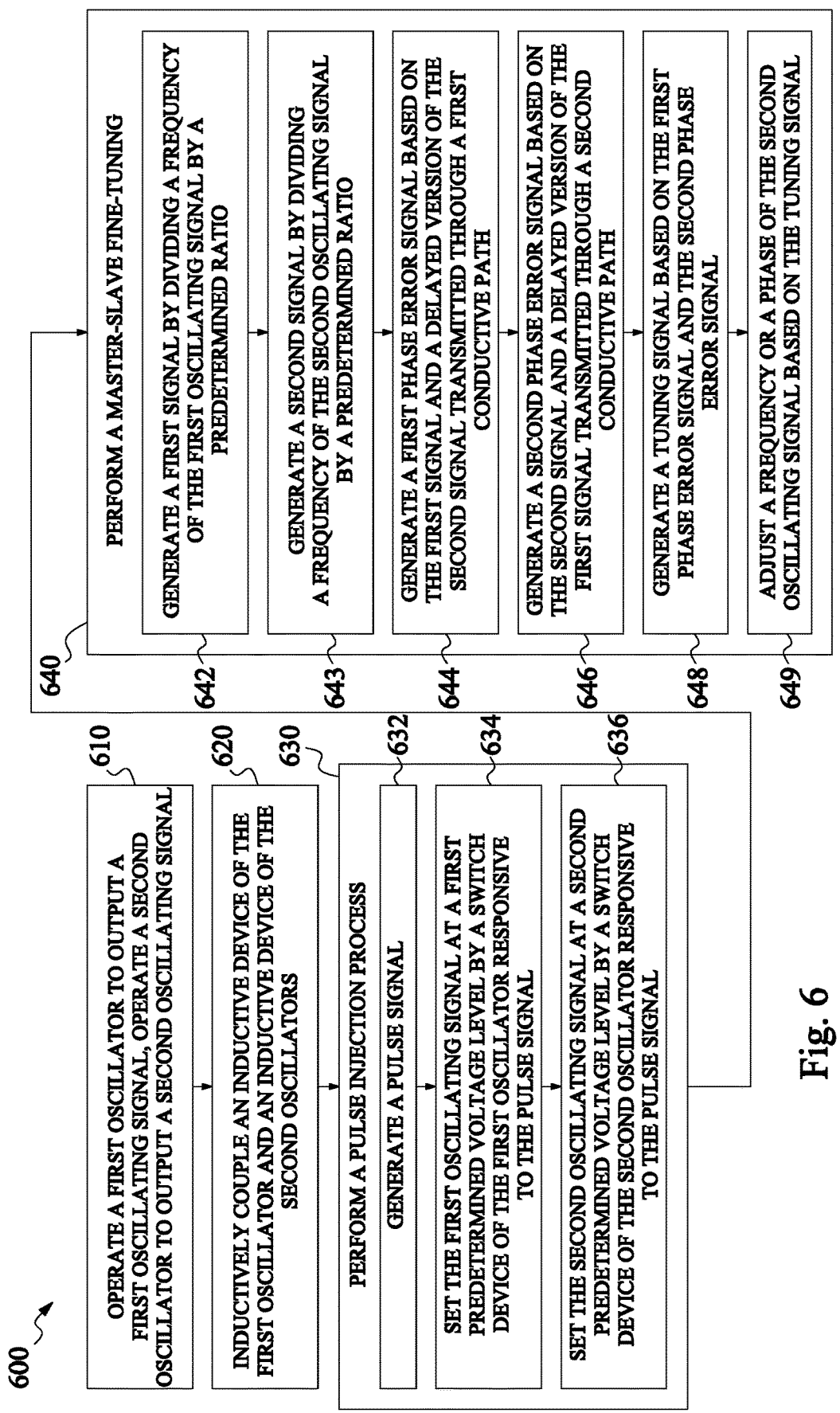
FIG. 6 is a flowchart of a method of synchronizing oscillators in accordance with one or more embodiments.

FIG. 6 is a flowchart of a method 600 of synchronizing oscillators, such as oscillators 100A and 100B depicted in FIG. 1, in accordance with one or more embodiments. It is understood that additional operations may be performed before, during, and/or after the method 600 depicted in FIG. 6, and that some other processes may only be briefly described herein.

In operation 610, oscillators are operated to output oscillating signals. For example, in some embodiments, oscillator 100A is operated to output a first oscillating signal at node 152A, and oscillator 100B is operated to output a second oscillating signal at node 152B.

In operation 620, inductive devices of oscillators are magnetically coupled. For example, in some embodiments, inductive device 110A of oscillator 100A and inductive device 110B of oscillator 100B are magnetically coupled in order to reduce a frequency difference or phase difference between output oscillating signals of oscillator 100A and oscillator 100B.

In operation 630, a pulse injection process is performed on various oscillators. For example, in some embodiments, a pulse injection process is performed on oscillator 100A and oscillator 100B. In some embodiments, operation 630 includes generating a pulse signal (operation 632), transmitting the pulse signal to switch device 140A of oscillator 100A through a first conductive path, and transmitting the pulse signal to switch device 140B of oscillator 100B through a second conductive path. In some embodiments, the first conductive path and the second conductive path are configured to impose substantially a same delay to the pulse signal.

In some embodiments, operation 630 further includes setting the first oscillating signal of oscillator 100A at a first predetermined voltage level by switch device 140A responsive to the pulse signal (operation 634), and setting the second oscillating signal of oscillator 100B at a first predetermined voltage level by switch device 140B responsive to the pulse signal (operation 636).

The method proceeds to operation 640, where a master-slave fine-tuning process is performed on two or more oscillators. For example, in some embodiments, a master-slave fine-tuning process is performed on oscillator 100A and oscillator 100B. As depicted in FIGS. 6 and 4, operation 640 includes generating reference signal CLK_MR by frequency-dividing oscillating signal from oscillator 402 or 100B by a predetermined ratio (operation 642); and generating reference signal CLK_SR by frequency-dividing oscillating signal from oscillator 404 or 100A by the predetermined ratio (operation 643).

Furthermore, in operation 645, a first phase error signal 442 is generated based on reference signal CLK_MR and delayed version CLK_SR' of reference signal CLK_SR transmitted through conductive path 422. In operation 646, a second phase error signal 444 is generated based on reference signal CLK_SR and a delayed version CLK_MR' of reference signal CLK_MR transmitted through conductive path 424. In operation 648, a tuning signal $V_{TUNE}$ is generated based on the first phase error signal 422 and the second phase error signal 424.

As depicted in FIGS. 6 and 1, in operation 649, a frequency or a phase of oscillating signal generated by oscillator 404 or 100A is adjusted based on the tuning signal $V_{TUNE}$.

In some embodiments when synchronizing oscillators 100A and 100B of FIG. 1, either or both of operation 630 or operation 640 is/are omitted.

Moreover, the pulse distribution network 500 in FIG. 5 and pulse-injection process (operation 630) are applicable to other type of oscillators and not limited to LC tank oscillators. In some embodiments, pulse-injection process or pulse-injection mechanism described above is also applicable to a particular type of oscillator known as ring oscillators.

Figure 7:
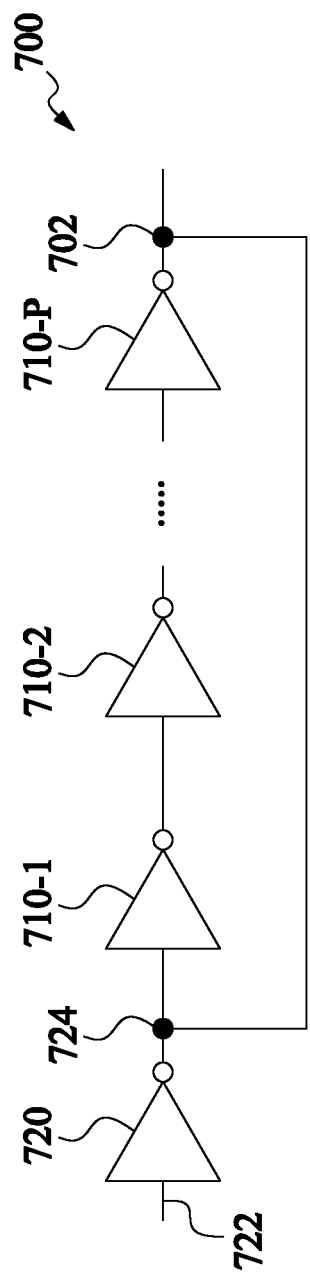
FIG. 7 is a schematic diagram of a ring oscillator in accordance with one or more embodiments.

For example, FIG. 7 is a schematic diagram of a ring oscillator 700 in accordance with one or more embodiments. Oscillator 700 has an output node 702 and P inverters 710-1 to 710-P, where P is an odd integer. Inverters 710-1 to 710-P are connected in series. Furthermore, output terminal of the last stage inverter 710-P is coupled with output node 702, and input terminal of the first stage inverter 710-1 is coupled with output terminal of inverter 710-P. Inverters 710-1 to 710-P are configured to be an active feedback device and to generate an oscillating signal at output node 702. Another inverter 720 has an input terminal configured to receive a pulse signal and an output terminal coupled with first node 702. Inverter 720 functions as a reset device configured to set output oscillating signal at node 704 at a predetermined voltage level responsive to the pulse signal. In some embodiments, two or more ring oscillators similar to oscillator 700 (e.g., oscillators 532 and 534 in FIG. 5) are connected to various ends of a pulse distribution network similar to pulse distribution network 500 in order to synchronizing output oscillating signals of the two or more ring oscillators.

Figure 8:
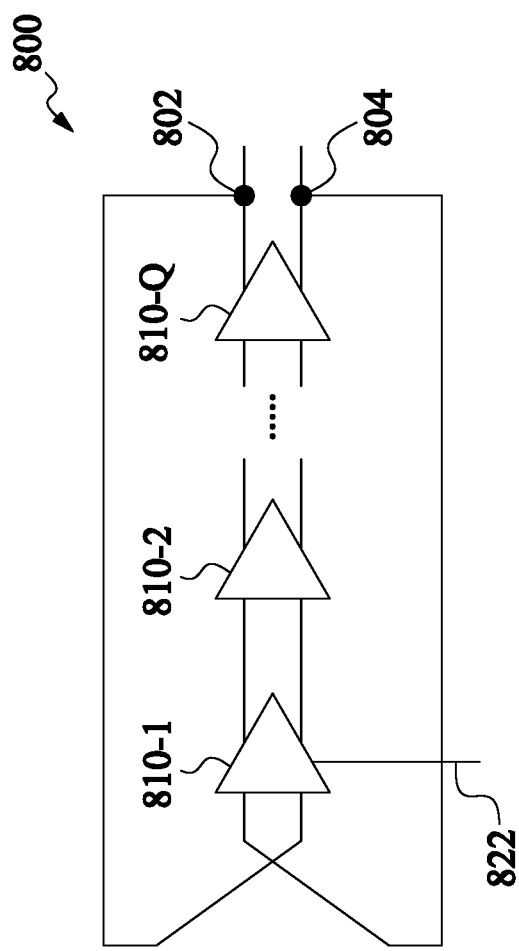
FIG. 8 is a schematic diagram of another ring oscillator in accordance with one or more embodiments.

FIG. 8 is a schematic diagram of another ring oscillator 800 in accordance with one or more embodiments. Oscillator 800 has a pair of output nodes 802 and 804 and Q differential amplifiers 810-1 to 810-Q, where Q is an odd integer. Amplifiers 810-1 to 810-Q are connected in series. Output terminals of the last stage amplifier 810-Q are coupled with output nodes 802 and 804, and input terminals of the first stage amplifier 810-1 are coupled with output terminals of amplifier 810-Q. Amplifiers 810-1 to 810-Q are configured as an active feedback device and to generate a pair of differential oscillating signals at output nodes 802 and 804. One of the amplifiers, such as amplifier 810-1, further includes a switch device or a reset device configured to set output terminals of that amplifier 810-1 at a predetermined voltage level responsive to a pulse signal. In some embodiments, any differential amplifier among amplifiers 810-1 to 810-Q is usable for pulse signal injection. In some embodiments, two or more ring oscillators similar to oscillator 800 (e.g., oscillators 532 and 534 in FIG. 5) are connected to various ends of a pulse distribution network similar to pulse distribution network 500 in order to synchronizing output oscillating signals of the two or more ring oscillators.

Figure 9:
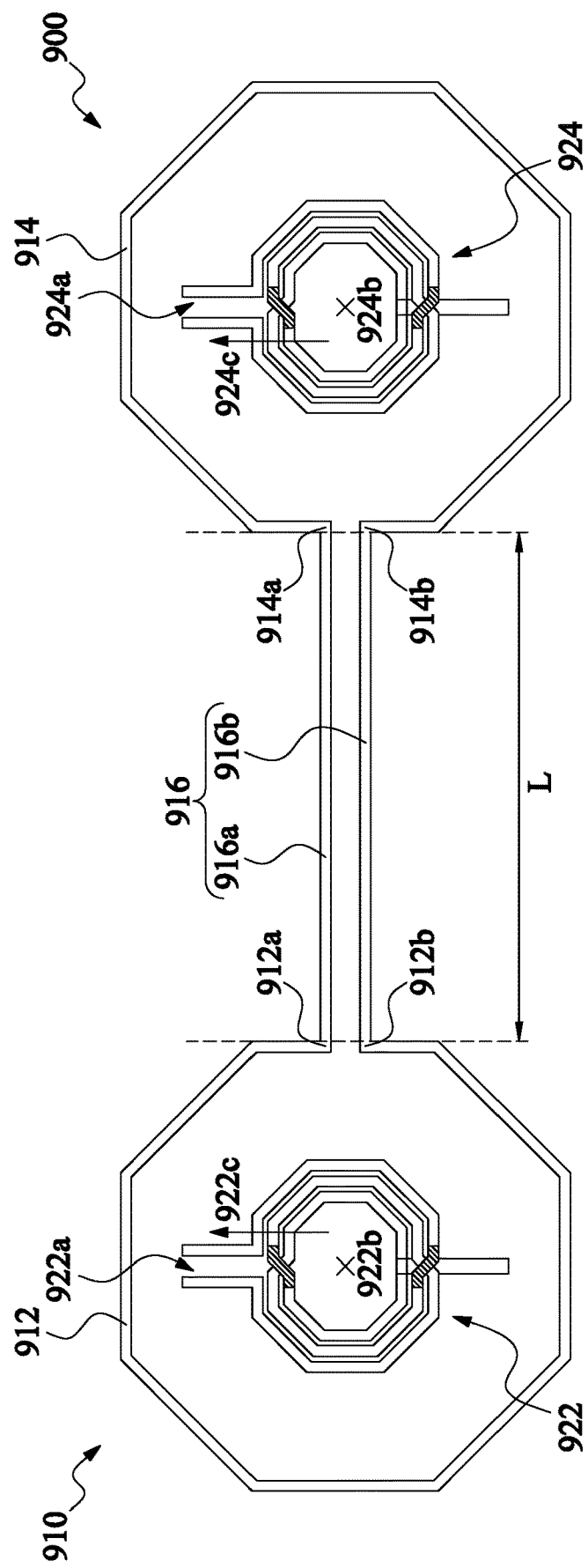
FIG. 9 is a top view of a coupling structure and corresponding inductive devices in accordance with one or more embodiments.

FIG. 9 is a top view of a portion of a circuit 900 including a coupling structure 910 and corresponding first and second inductive devices 922 and 924 in accordance with one or more embodiments. In some embodiments, inductive devices 922 and 924 correspond to inductive devices 110A and 110B in FIG. 1 or inductive devices 310A to 310F in FIG. 3. In some embodiments, coupling structure 910 is configured to facilitate the magnetic coupling 180 in FIG. 1 or magnetic coupling 308A to 380G in FIG. 3.

Coupling structure 910 includes a first conductive loop 912, a second conductive loop 914, and a set of conductive paths 916 electrically connecting first conductive loop 912 and second conductive loop 914. First conductive loop 912 and second conductive loop 914 have a shape of an octagon loop. In some embodiments, first conductive loop 912 and second conductive loop 914 have a shape of a polygon loop or a circular loop. First conductive loop 912, second conductive loop 914, and the set of conductive paths 916 are formed in various interconnection layers of one or more chips. First conductive loop 912 surrounds the first inductive device 922 as observed from a top view perspective. Second conductive loop 914 surrounds the second inductive device 924 as observed from the top view perspective.

Figure 10:
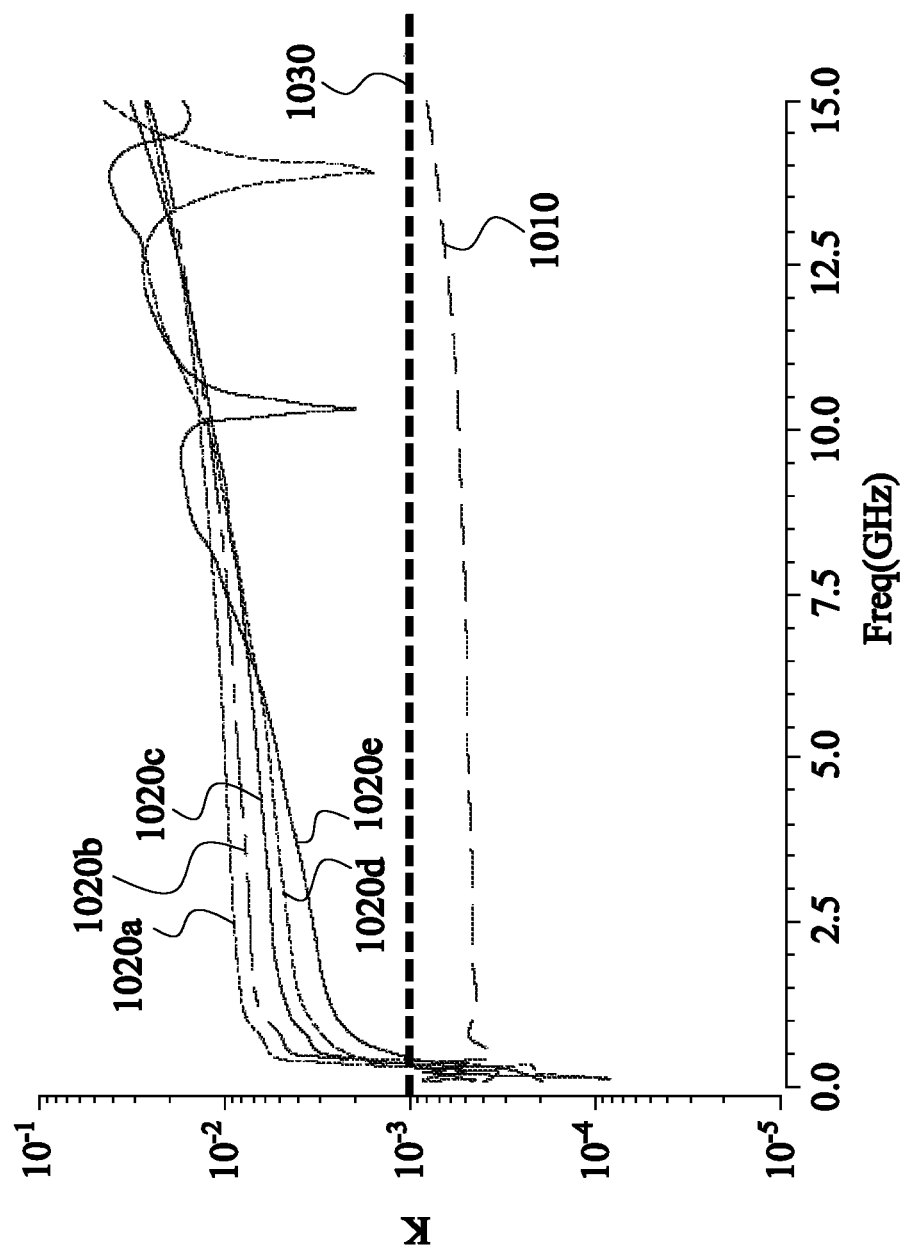
FIG. 10 is a diagram of coupling factor versus frequency between two inductive devices, with or without a coupling structure, in accordance with one or more embodiments.

First inductive device 922 has a signal port 922a corresponding to an opening of a coil of inductive device 922, a center of the coil 922b, and a port direction 922c. Second inductive device 924 has a signal port 924a corresponding to an opening of a coil of inductive device 924, a center of the coil 924b, and a port direction 924c. In FIG. 10, port directions 922c and 924c point to the same direction. In some embodiments, port directions 922c and 924c point to different directions.

First conductive loop 912 includes a first end 912a and a second end 912b. Second conductive loop 914 includes a first end 914a and a second end 914b. The set of conductive paths 916 includes a first conductive path 916a and a second conductive path 916b. First conductive path 916a electrically connects first end 912a of first conductive loop 912 and first end 914a of second conductive loop 914. Second conductive path 916b electrically connects second end 912b of first conductive loop 912 and second end 914b of second conductive loop 914. A length L is defined as the length of a space between first conductive loop 912 and second conductive loop 914. In some embodiments, length L is equal to or greater than 100 µm.

In some embodiments, an induced current is generated at first conductive loop 912 responsive to a first magnetic field generated by first inductive device 922. The induced current is transmitted to second conductive loop 914 through the set of conductive paths 916 and generates a second magnetic field within the second conductive loop 914. Accordingly, a mutual inductance between the first and second inductive devices 922 and 924 is less dependent from the field distribution of first magnetic field and more dependent from the second magnetic field reproduced by the induced current. As a result, a mutual inductance between the first and second inductive devices 922 and 924 is independent of a distance between inductive devices 922 and 924, such as when the length L is equal to or greater than 100 μm.

FIG. 10 is a diagram of coupling factor K versus frequency Freq between two inductive devices, such as inductive devices 922 and 924, with or without a coupling structure, in accordance with one or more embodiments. Curve 1010 represents a coupling factor K between inductive devices 922 and 924 when there is no coupling structure 910 and a distance therebetween is set to be 1000 μm. Curve 1020a represents a coupling factor K between inductive devices 922 and 924, with coupling structure 910 and a length L set to be 500 μm; curve 1020b represents a coupling factor K if length L is 1000 μm; curve 1020c represents a coupling factor K if length L is 2000 μm; curve 1020d represents a coupling factor K if length L is 3000 μm; and curve 1020e represents a coupling factor K if length L is 5000 μm. Reference line 1030 represents a K value of 0.001 ($10^{-3}$).

Coupling factor K is defined as:

$$K = \frac{M}{\sqrt{L_1 L_2}}$$

M is the mutual conductance between inductive devices 922 and 924, $L_1$ is the self-inductance of first inductive device 922, and $L_2$ is the self-inductance of first inductive device 924. If the K value is greater than 0.001 (reference line 1030), oscillators corresponding to inductive devices 922 and 924 have meaningful magnetic coupling sufficient to maintain a stable phase difference therebetween.

As shown by curve 1010 in FIG. 10, at a distance of 1000 μm, a configuration without coupling structure 910 no longer ensures sufficient magnetic coupling between inductive devices 922 and 924. In contrast, curves 1020a-1020e demonstrate that an embodiment with coupling structure 910 renders the magnetic coupling between inductive devices 922 and 924 independent of the distance therebetween. As shown in FIG. 10, after 500 MHz, curves 1020a-1020e are all above reference line 1030 for length L set to 500, 1000, 2000, 3000, or 5000 μm.

Some possible variations along the embodiment of FIG. 9 are further illustrated in conjunction with FIGS. 11A-15. In some embodiments, variations as illustrated in FIGS. 11A-15 are combinable to form yet a different variation consistent with the ideas as demonstrated in conjunction with FIG. 9 and FIGS. 11A-15.

Figure 11A:
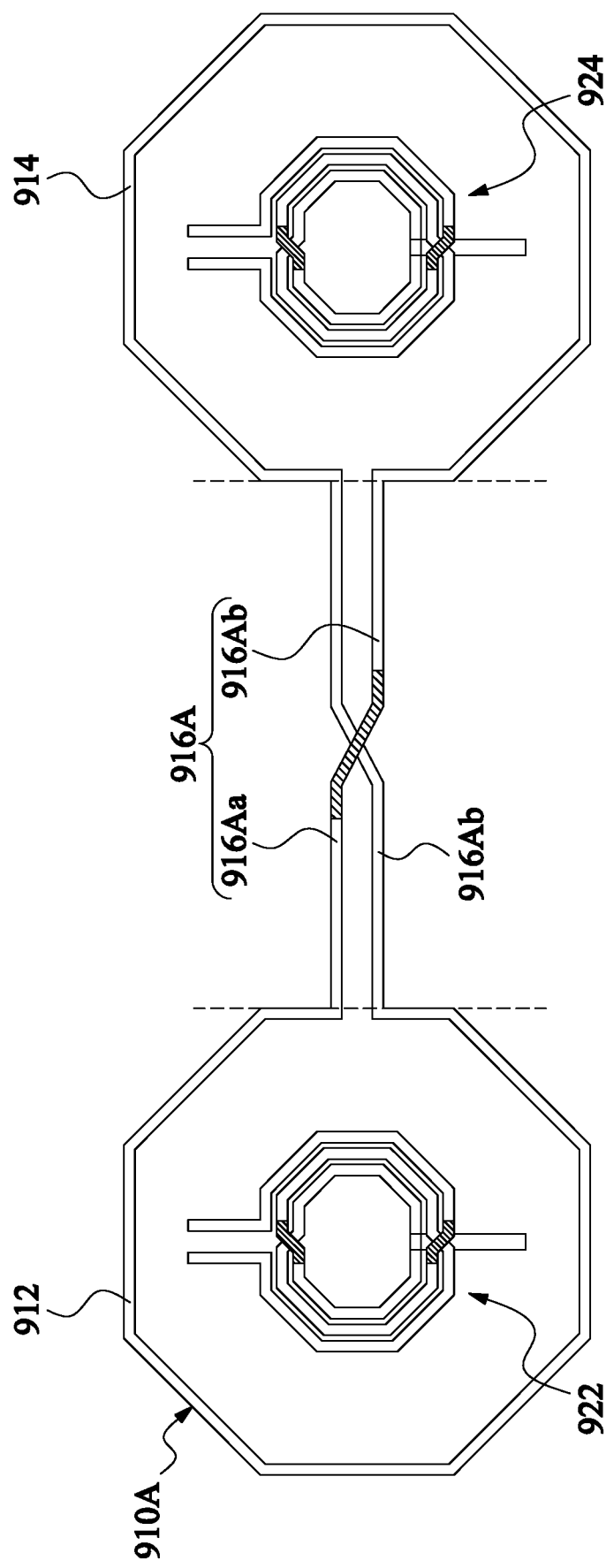
FIGS. 11A-C are top views of coupling structures and corresponding inductive devices in accordance with one or more embodiments.

FIG. 11A is a top view of a coupling structure 910A and corresponding inductive devices 922 and 924 in accordance with one or more embodiments. The components the same or similar to those in FIG. 9 are given the same reference numbers, and detailed description thereof is omitted.

Compared with coupling structure 910, coupling structure 910A includes a set of conductive paths 916A in place of the set of conductive paths 916. The set of conductive paths 916A includes a first conductive path 916Aa and a second conductive path 916Ab. First conductive path 916Aa and second conductive path 916Ab are routed such that first conductive path 916Aa crosses over second conductive path 916Ab at location 1110 as observed from a top view perspective.

Figure 11B:
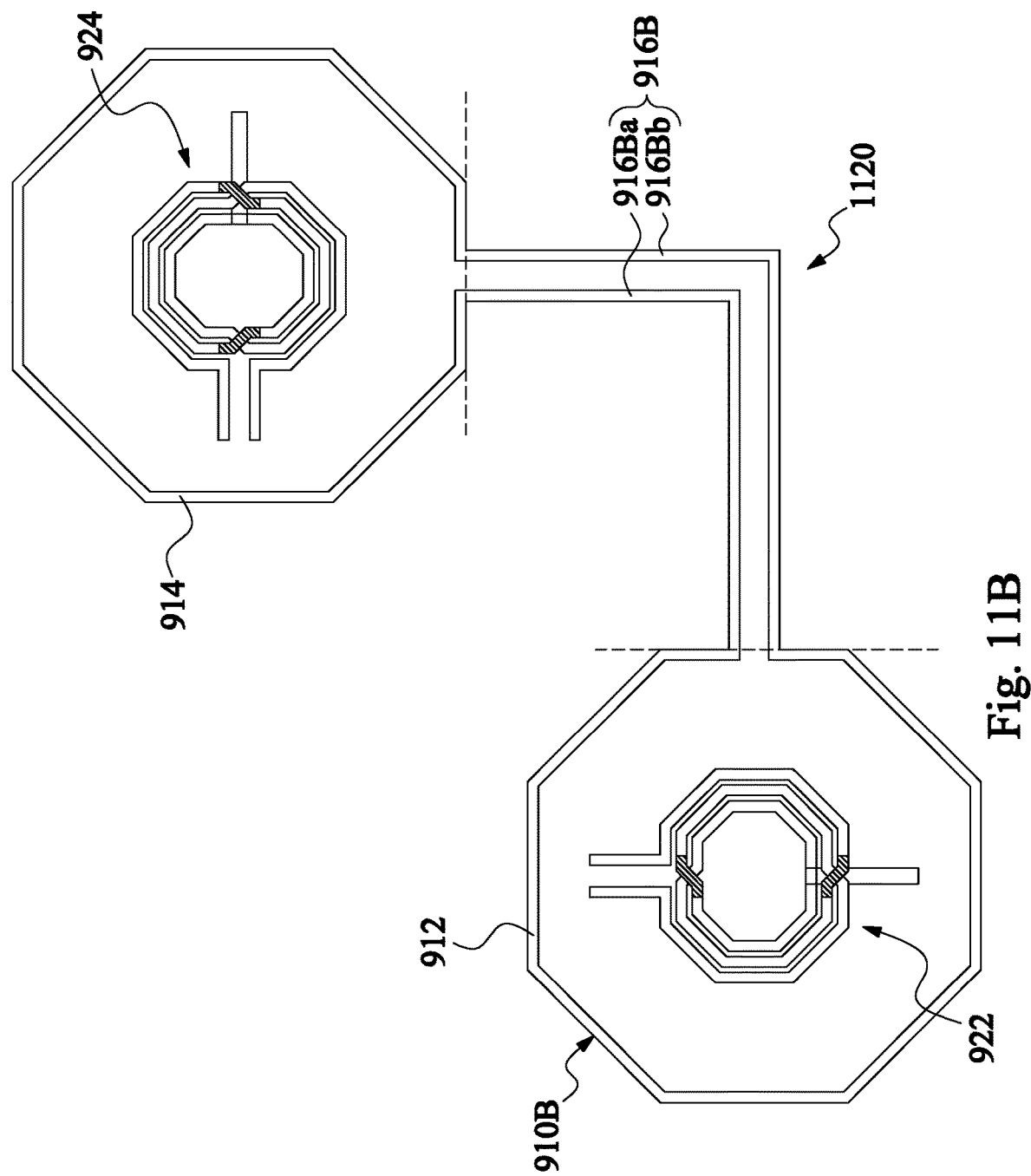

FIG. 11B is a top view of a coupling structure 910B and corresponding inductive devices 922 and 924 in accordance with one or more embodiments. The components the same or similar to those in FIG. 9 are given the same reference numbers, and detailed description thereof is omitted.

Compared with coupling structure 910, coupling structure 910B includes a set of conductive paths 916B in place of the set of conductive paths 916. The set of conductive paths 916B includes a first conductive path 916Ba and a second conductive path 916Bb. First conductive path 916Ba and second conductive path 916Bb are routed such that each one of first conductive path 916Ba and second conductive path 916Bb has an angled corner at location 1120 as observed from a top view perspective.

Figure 11C:
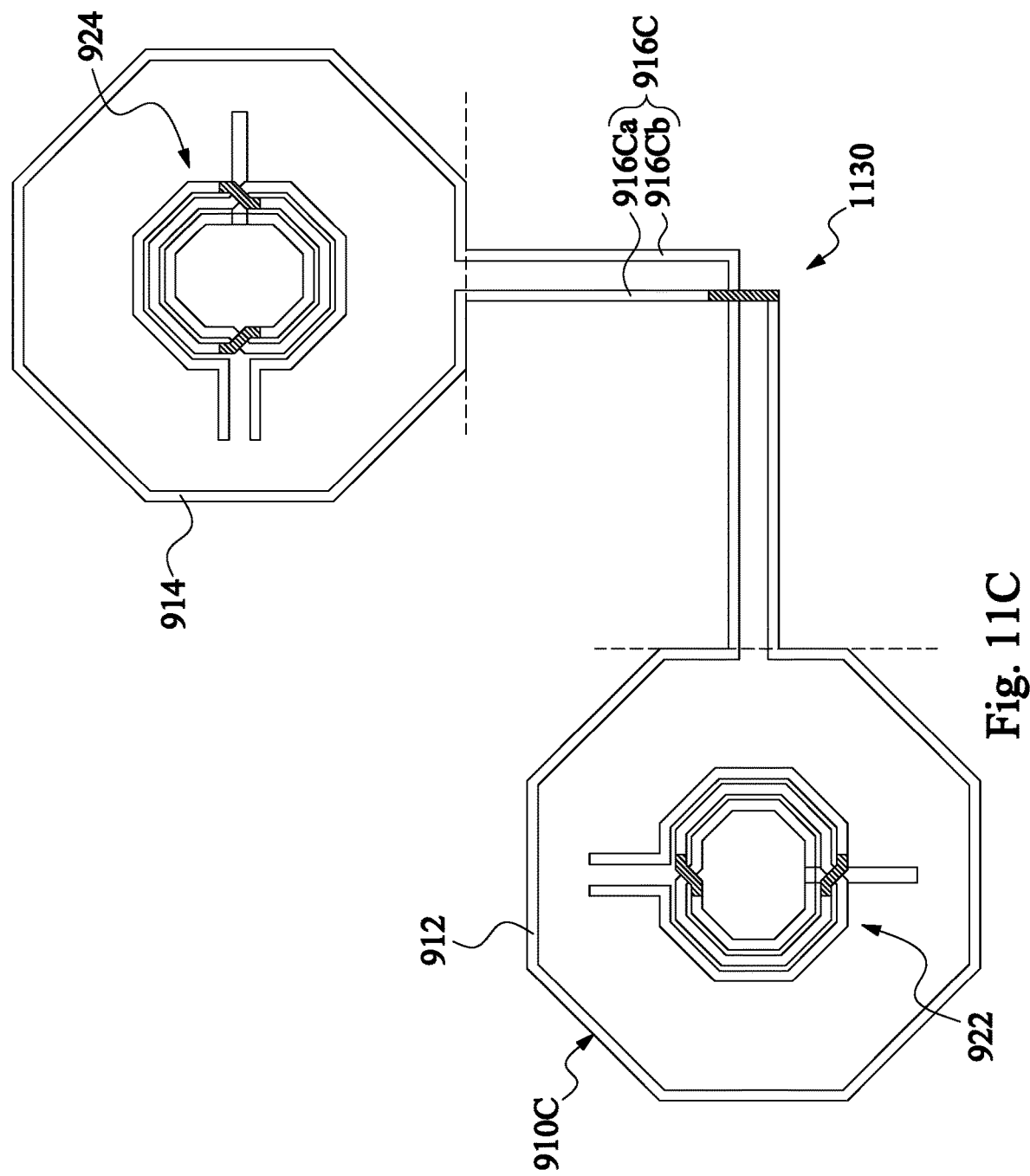

FIG. 11C is a top view of a coupling structure 910C and corresponding inductive devices 922 and 924 in accordance with one or more embodiments. The components the same or similar to those in FIG. 9 are given the same reference numbers, and detailed description thereof is omitted.

Compared with coupling structure 910, coupling structure 910C includes a set of conductive paths 916C in place of the set of conductive paths 916. The set of conductive paths 916C includes a first conductive path 916Ca and a second conductive path 916Cb. First conductive path 916Ca and second conductive path 916Cb are routed such that each one of first conductive path 916Ca and second conductive path 916Cb has an angled corner at location 1130 as observed from a top view perspective. Also, first conductive path 916Ca crosses over second conductive path 916Cb at location 1130 as observed from the top view perspective.

Figure 12A:
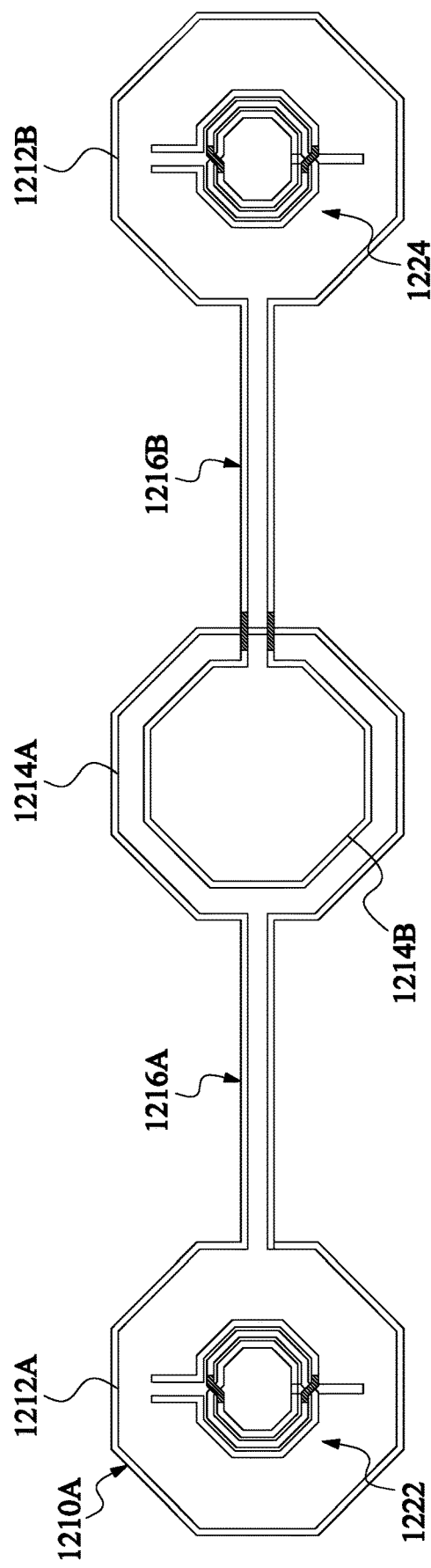

FIG. 12A is a top view of a coupling structure 1210A and corresponding inductive devices 1222 and 1224 in accordance with one or more embodiments. Coupling structure 1210A includes a first conductive loop 1212A, a second conductive loop 1214A, a first set of conductive paths 1216A electrically connecting conductive loops 1212A and 1214A, a third conductive loop 1212B, a fourth conductive loop 1214B, and a second set of conductive paths 1216B electrically connecting conductive loops 1212B and 1214B. A first inductive device 1222 is magnetically coupled with first conductive loop 1212A. A second inductive device 1224 is magnetically coupled with third conductive loop 1212B. Second conductive loop 1214A is magnetically coupled with fourth conductive loop 1214B. Second conductive loop 1214A surrounds fourth conductive loop 1214B as observed from a top view perspective.

In some embodiments, a first induced current is generated at first conductive loop 1212A responsive to a first magnetic field generated by first inductive device 1222. The first induced current is transmitted to second conductive loop 1214A through the first set of conductive paths 1216A and generates a second magnetic field within second conductive loop 1214A. A second induced current is generated at fourth conductive loop 1214B responsive to the second magnetic field. The second induced current is transmitted to third conductive loop 1214B through the second set of conductive paths 1216B and generates a third magnetic field within third conductive loop 1214B. Accordingly, second inductive device 1224 is magnetically coupled with first inductive device 1222 through the third magnetic field reproduced by the second induced current within third conductive loop 1214B.

Figure 12B:
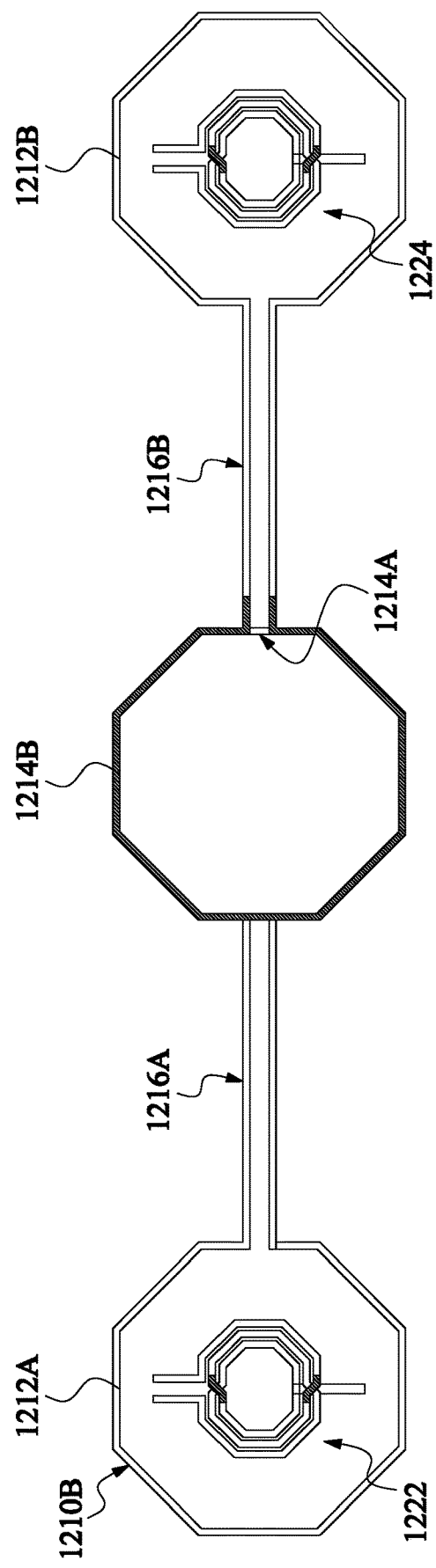

FIG. 12B is a top view of a coupling structure 1210B and corresponding inductive devices 1222 and 1224 in accordance with one or more embodiments. Components that are the same or similar to those in FIG. 12A are given the same reference numbers, and detailed description thereof is omitted. Compared with coupling structure 1210A, second conductive loop 1214A and fourth conductive loop 1214B overlap as observed from a top view perspective. In other words, second conductive loop 1214A and fourth conductive loop 1214B have the same size and shape but formed on different interconnection layers.

Figure 12C:
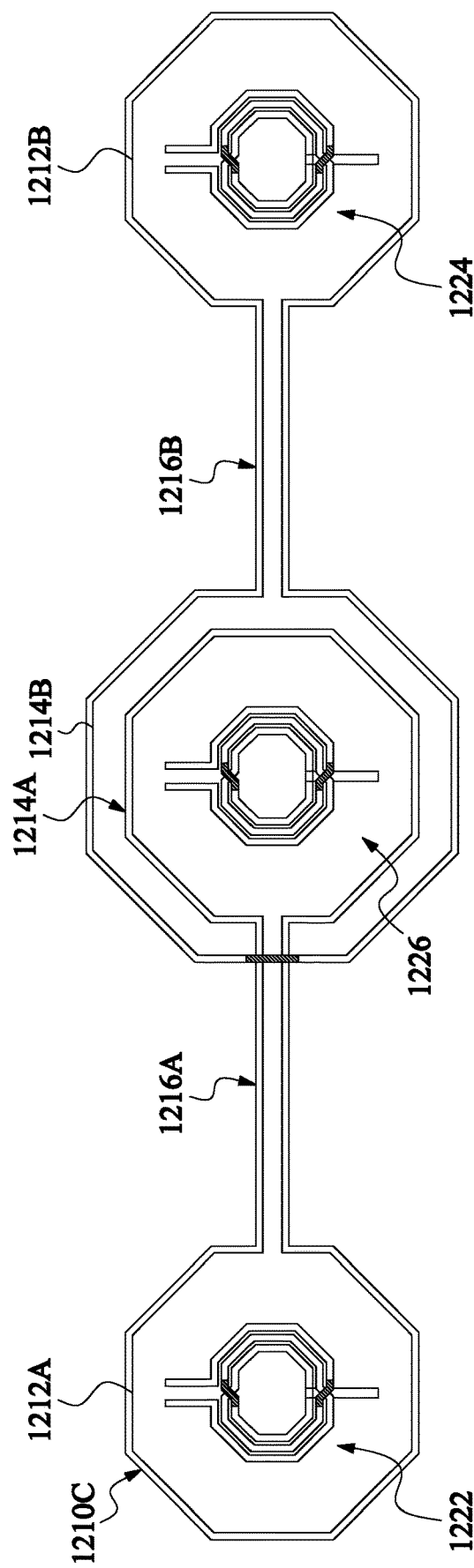

FIG. 12C is a top view of a coupling structure 1210C and corresponding inductive devices 1222, 1224, and 1226 in accordance with one or more embodiments. Components that are the same or similar to those in FIG. 12A are given the same reference numbers, and detailed description thereof is omitted. Compared with coupling structure 1210A, second conductive loop 1214A and fourth conductive loop 1214B are arranged to magnetically couple with an additional inductive device 1226. Also, fourth conductive loop 1214B surrounds second conductive loop 1214A as observed from a top view perspective.

FIG. 12D is a top view of a coupling structure 1210D and corresponding inductive devices 1222, 1224, and 1226 in accordance with one or more embodiments. Components that are the same or similar to those in FIG. 12B are given the same reference numbers, and detailed description thereof is omitted. Compared with coupling structure 1210B, second conductive loop 1214A and fourth conductive loop 1214B are arranged to magnetically couple with an additional inductive device 1226.

FIG. 12E is a top view of a coupling structure 1210E and corresponding inductive devices 1222, 1224, and 1226 in accordance with one or more embodiments. Components that are the same or similar to those in FIG. 12D are given the same reference numbers, and detailed description thereof is omitted. Compared with coupling structure 1210D, a set of conductive paths 1216B' is used in place of second set of conductive paths 1216B, where one conductive path of the set of conductive paths 1216B' crosses over another conductive path of the set of conductive paths 1216B' at location 1230.

Figure 13A:
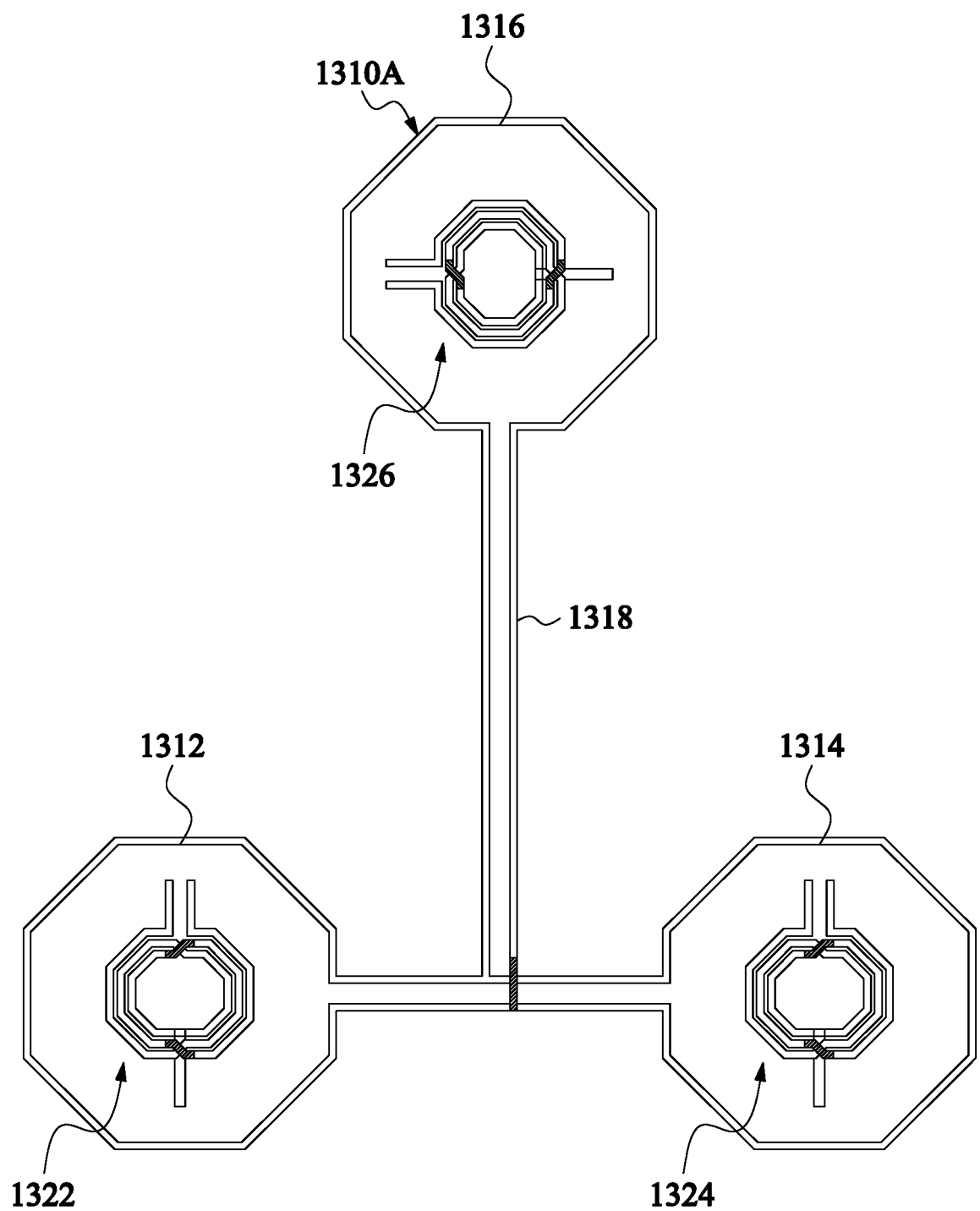
FIGS. 13A-B are top views of coupling structures and corresponding inductive devices in accordance with one or more embodiments.

FIG. 13A is a top view of a coupling structure 1310A and corresponding inductive devices 1322, 1324, and 1326 in accordance with one or more embodiments. Coupling structure 1310A includes three conductive loops 1312, 1314, and 1316 electrically coupled together through a set of conductive paths 1318. Each one of conductive loops 1312, 1314, and 1316 is magnetically coupled with a corresponding one of inductive devices 1322, 1324, and 1326.

Figure 13B:
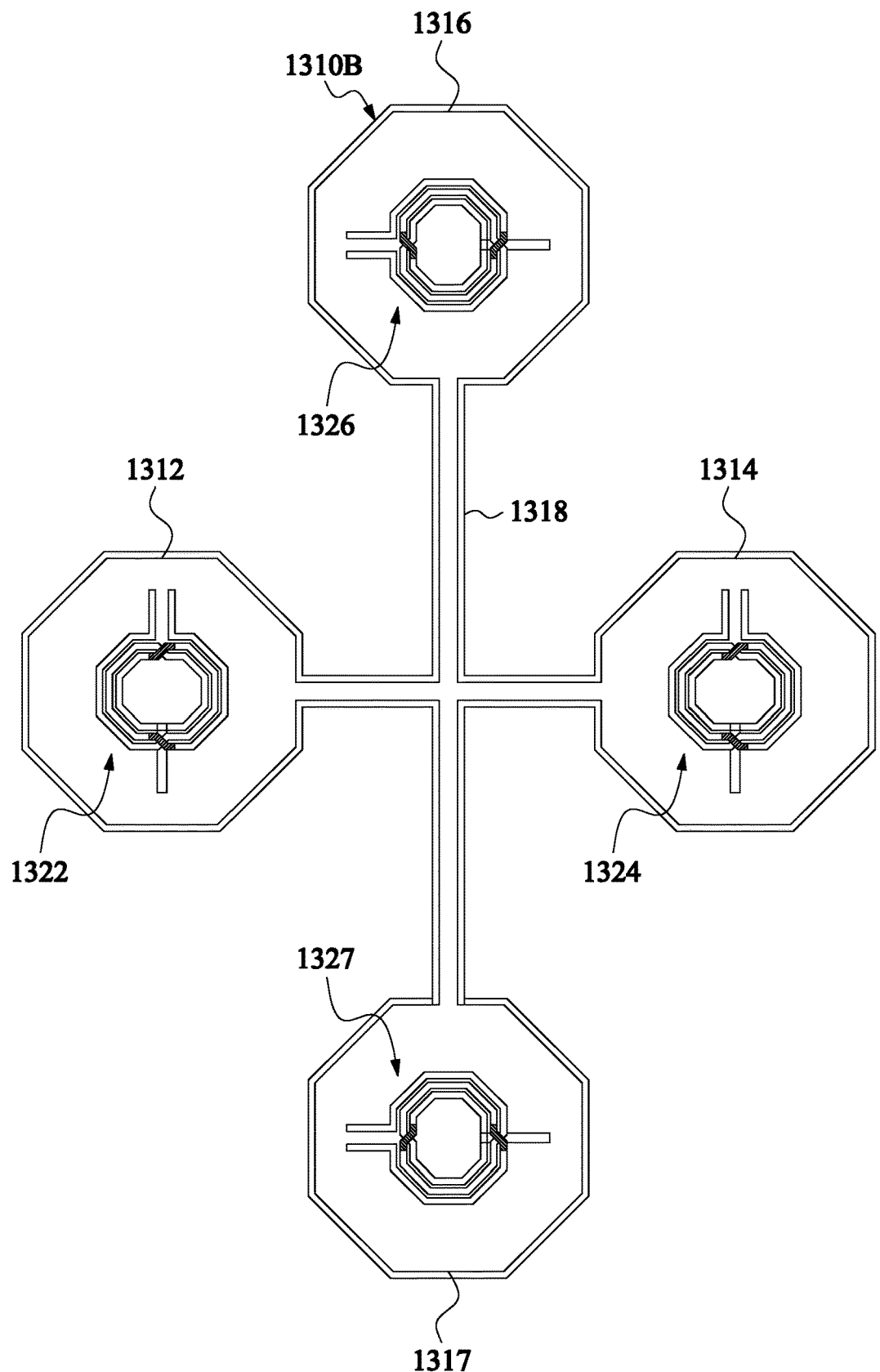

FIG. 13B is a top view of a coupling structure 1310B and corresponding inductive devices 1322, 1324, 1326, and 1327 in accordance with one or more embodiments. Components that are the same or similar to those in FIG. 13A are given the same reference numbers, and detailed description thereof is omitted. Coupling structure 1310B includes four conductive loops 1312, 1314, 1316, and 1317 electrically coupled together through a set of conductive paths 1318. Each one of conductive loops 1312, 1314, 1316, and 1317 is magnetically coupled with a corresponding one of inductive devices 1322, 1324, 1326, and 1327.

FIG. 14 is a top view of a coupling structure 1410 and corresponding inductive devices 922 and 924 in accordance with one or more embodiments. Components that are the same or similar to those in FIG. 9 are given the same reference numbers, and detailed description thereof is omitted. Coupling structure 1410 includes two conductive loops 1412 and 1414 electrically coupled together through a set of conductive paths 1416. Each one of conductive loops 1412 and 1416 is magnetically coupled with a corresponding one of inductive devices 922 and 924. Moreover, inductive device 922 surrounds conductive loop 1412 as observed from a top view perspective; and inductive device 924 surrounds conductive loop 1414 as observed from the top view perspective.

FIG. 15 is a top view of a coupling structure 910 with shielding structures 1512 and 1514 and corresponding inductive devices 922 and 924 in accordance with one or more embodiments. Components that are the same or similar to those in FIG. 9 are given the same reference numbers, and detailed description thereof is omitted. Compared with the circuit 900 in FIG. 9, the circuit depicted in FIG. 15 further includes a first shielding structure 1512 and a second shielding structure 1514. At least a portion of the set of conductive paths 916 is between first shielding structure 1512 and second shielding structure 1514 as observed from a top view perspective.

Figure 16:
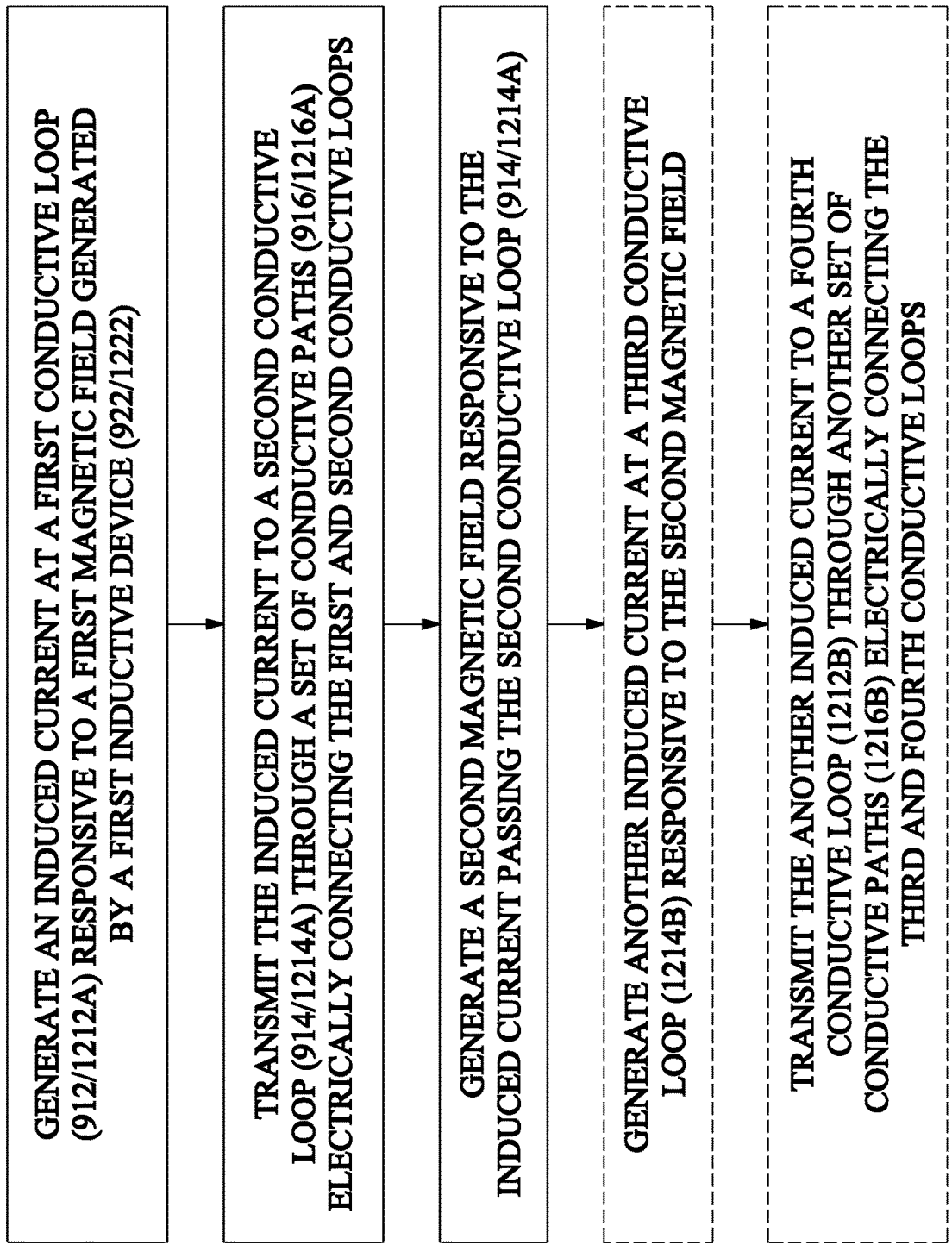
FIG. 16 is a flowchart of a method of magnetically coupling inductive devices in accordance with one or more embodiments.

FIG. 16 is a flowchart of a method 1600 of magnetically coupling inductive devices in accordance with one or more embodiments. In some embodiments, method 1600 is usable in conjunction with the circuit in FIG. 9 or FIG. 12A. In some embodiments, method 1600 is also usable in conjunction with the circuit in FIGS. 11A-11C, FIGS. 12B-12E, or FIGS. 13A-15. It is understood that additional operations may be performed before, during, and/or after the method 1600 depicted in FIG. 16, and that some other processes may only be briefly described herein.

The process begins with operation 1610, where an induced current is generated at a first conductive loop 912 or 1212A responsive to a first magnetic field of a first oscillator generated by a first inductive device 922 or 1222.

The process proceeds to operation 1620, where the induced current is transmitted to a second conductive loop 914 or 1214A through a set of conductive paths 916 or 1216A electrically connecting the first and second conductive loops.

The process proceeds to operation 1630, where a second magnetic field is generated responsive to the induced current passing the second conductive loop 914 or 1214A.

For a coupling structure having a configuration the same or similar to FIG. 12A or FIGS. 12B-E, the process proceeds to operation 1640, where another induced current is generated at a third conductive loop 1214B responsive to the second magnetic field.

The process proceeds to operation 1650, where the another induced current is transmitted to a fourth conductive loop 1212B through another set of conductive paths 1216B electrically connecting the third and fourth conductive loops.

As a result, a second inductive device 924 or 1224 of a second oscillator is magnetically coupled with the first inductive device 922 or 1222 of the first oscillator through the coupling structure 910 or 1210.

Figure 17:
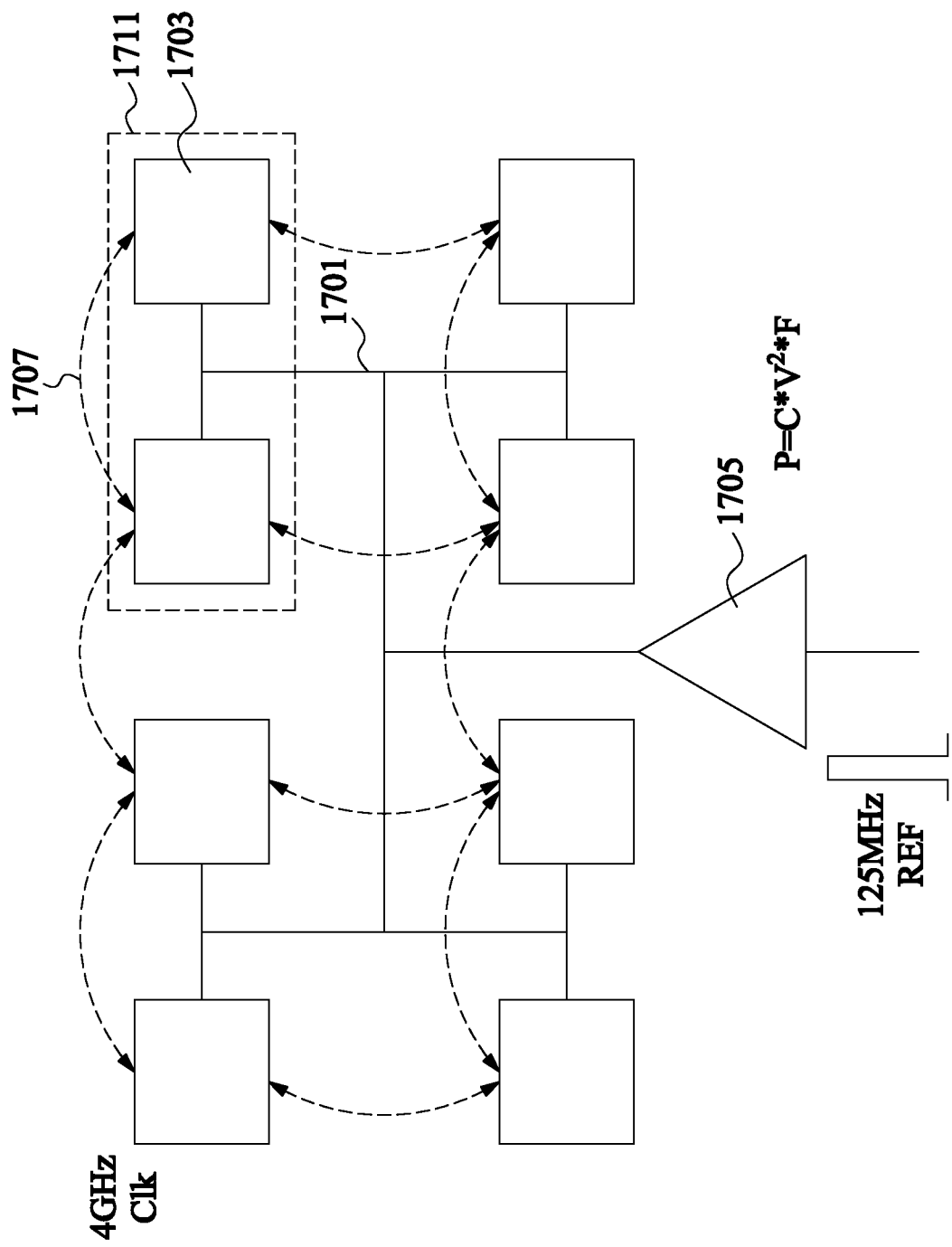
FIG. 17 is a clock distribution network in accordance with one or more embodiments.

FIG. 17 illustrates yet another embodiment in which coupled oscillators may be utilized in order to supply clock signals throughout a clock tree. In this embodiment, a clock distribution network 1701, instead of using a single high speed clock to drive the clock distribution network 1701, uses a low frequency reference clock that is propagated through the distributive paths in order to synchronize local digital controlled oscillators (DCOs) 1703. In an embodiment the clock distribution network 1701 may be similar to the pulse distribution network 500 described above with respect to FIG. 5, and certain embodiments include a clock pulse generator (not separately illustrated in FIG. 17), a clock driver 1705, and one or more conductive paths arranged to have an H-tree configuration and a power dissipation of $C*V^2*f$. However, any suitable configuration for the clock distribution network 1701 may be utilized.

At the endpoints of the clock distribution network 1701 (e.g., at the endpoints of the H-trees), the digital controlled oscillators 1703 are connected. In an embodiment the digital controlled oscillators 1703 receive the low frequency reference clock signal (from the clock driver 1705) and output a local high-frequency clock signal to the remaining circuitry. In a particular embodiment, the low frequency reference clock signal may be propagated throughout the clock distribution network 1701 at a frequency of between about 62.5 MHz and about 187.5 MHz, such as about 125 MHz. Additionally, the digital controlled oscillators 1703 receive the low frequency reference clock as an input and output the local high-frequency clock signal of between about 2 GHz and about 6 GHz, such as about 4 GHz. However, any suitable frequencies may be utilized.

Additionally, while the low frequency reference clock is used to injection lock the digital controlled oscillators 1703 to improve jitter performance, skew between the different local high-frequency clock signals that are output from different ones of the digital controlled oscillators 1703 (from, e.g., process, supply, and temperature variations) may be reduced by coupling the digital controlled oscillators 1703 together. In an embodiment the separate digital controlled oscillators 1703 are coupled together magnetically (as illustrated in FIG. 17 by the dashed lines labeled 1707). However, the digital controlled oscillators 1703 are not limited to being coupled only magnetically. Rather, any suitable method of coupling the oscillators, such as coupling the oscillators through transmission lines, may also be utilized, and all such coupling are fully intended to be included within the scope of the embodiments.

Figure 18A:
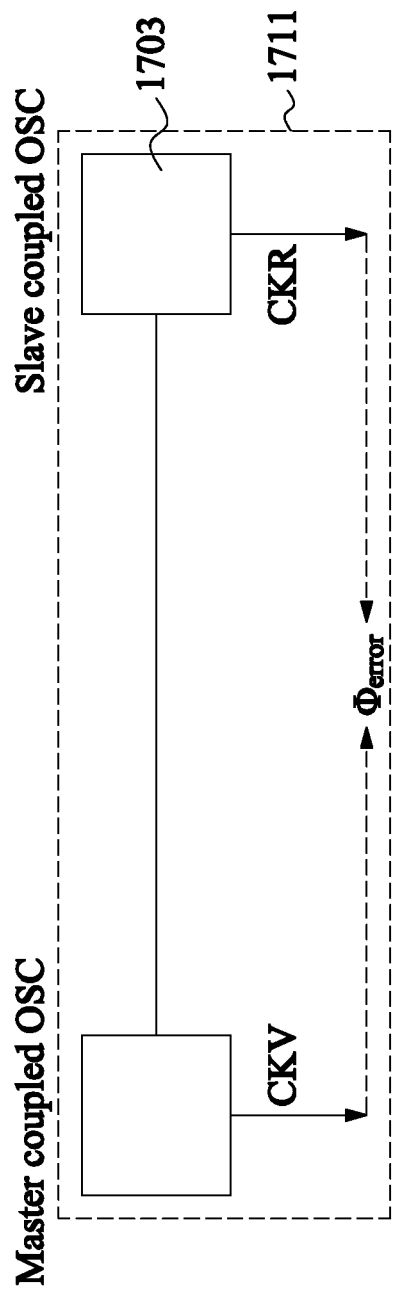
FIG. 18A-18B are views of coupled digital oscillators in accordance with one or more embodiments.
Figure 18B:
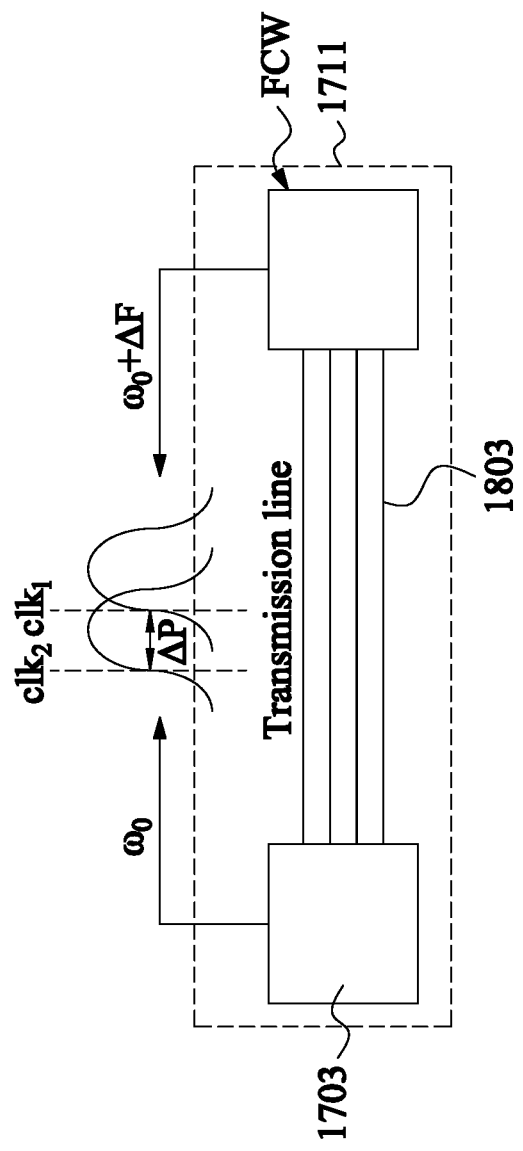

FIGS. 18A and 18B illustrate a close up view of two of the digital controlled oscillators 1703 within the dashed box 1711 in FIG. 17. In this embodiment a first one of the digital controlled oscillators 1703 is a master coupled oscillator which outputs a first high frequency signal CKV. Additionally, a second one of the digital controlled oscillators 1703 is a slave coupled oscillator which outputs a second high frequency signal CKR. Ideally, the first high frequency signal CKV and the second high frequency signal CKR are identical, but without some form of phase calibration, the first high frequency signal CKV and the second high frequency signal CKR will be out of phase, having a phase error $\Phi_{error}$ otherwise called skew.

FIG. 18B illustrates this phase error. In particular, when two of the digital controlled oscillators 1703 are coupled e.g., through a transmission line 1803 (made of, for example, polysilicon, a silicide, or a metal line) as illustrated or through a magnetic coupling, the output frequency $\omega_0$ of the digital controlled oscillators 1703 will be identical. However, there will also be a constant phase shift ΔP between the first high frequency signal CKV (e.g. $clk_2$) and the second high frequency signal CKR (e.g., $clk_1$. Additionally, this phase shift ΔP will be proportional to the difference in the natural frequencies Δf between the first digital controlled oscillator 1703 and the second digital controlled oscillator 1703. In particular embodiments, the relationship between the difference in natural frequencies Δf is close to being linear to the phase difference AP in the signals being output by the digital controlled oscillators 1703.

Figure 19:
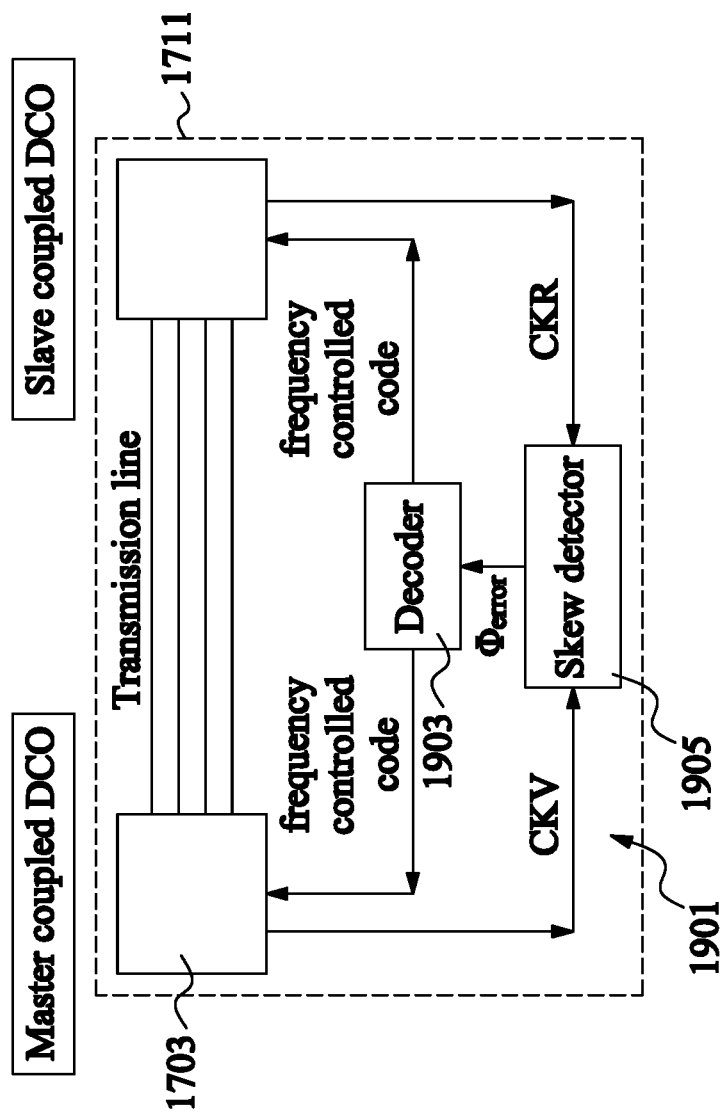
FIG. 19 is a calibration system in accordance with one or more embodiments.

FIG. 19 illustrates a calibration system 1901 which uses this relationship in the natural frequencies Δf to control the phase shift ΔP and calibrate the clock skew. In an embodiment the calibration system 1901 comprises a skew detector 1905 and a decoder 1903 connected to the decoder 1903. In an embodiment the first high frequency signal CKV and the second high frequency signal CKR are both routed to a skew detector 101 as they are also sent to the remainder of the circuitry. The skew detector 1905 may be used to receive the first high frequency signal CKV and the second high frequency signal CKR and detect the phase error $\Phi_{error}$ between the two signals. In a particular embodiment the skew detector 1905 can be a time-digital converter (TDC), a sample and hold d-type flip flop, a single d-type flip flop, or the like. However, any suitable structure that can be used to detect the phase error $\Phi_{error}$ between the first high frequency signal CKV and the second high frequency signal CKR may be utilized.

Once the phase error $\Phi_{error}$ between the first high frequency signal CKV and the second high frequency signal CKR has been determined by the skew detector 1905, the result of the phase error $\Phi_{error}$ is then sent to a decoder 1903 where it can be used to help control the natural frequency of the coupled digital controlled oscillators 1703. For example, because the phase error $\Phi_{error}$ is proportional to the difference in the natural frequencies of the digital controlled oscillators 1703, the resolution of the skew calibration is dominated by the resolution of the digital controlled oscillators 1703. To help calibrate and minimize the skew, the resolution of the digital controlled oscillators 1703 may be made as high as practical.

To improve the resolution of the digital controlled oscillators 1703, the overall inductance (L) of one of the digital controlled oscillators 1703 is split into a plurality of individual inductances. For example, in one embodiment the overall inductance L of one of the digital controlled oscillators 1703 is split into a first inductance of nL/2 and a second inductance of (1−n)L/2. However, any suitable split in the overall inductance may be utilized.

Figure 20:
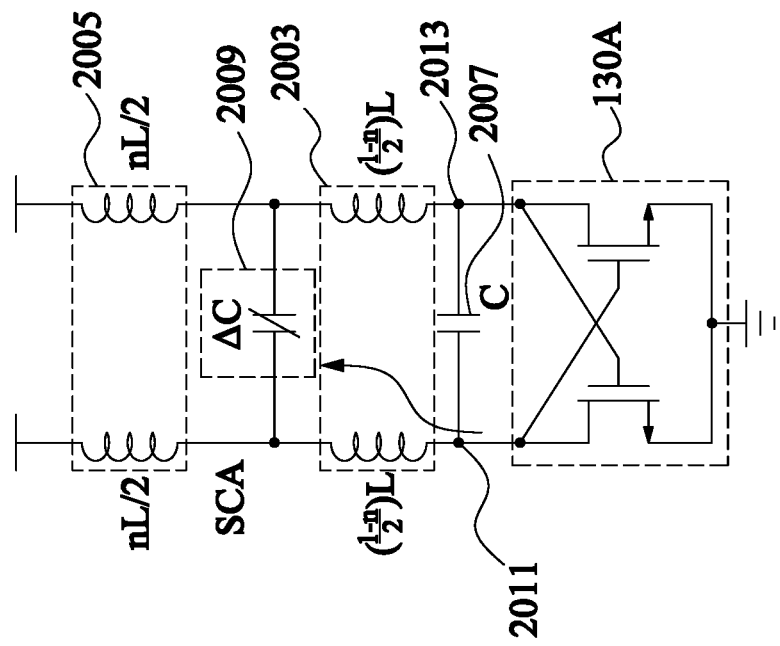
FIG. 20 is a digital controlled oscillator in accordance with one or more embodiments.

FIG. 20 illustrates an embodiment of an implementation of this split of the overall inductance into the digital controlled oscillators 1703. In one embodiment the digital controlled oscillator 1703 comprises the active feedback device 130A (described above with respect to FIG. 1), a first set of inductors 2003 (formed of, for example, polysilicon, silicide, or metal lines), a second set of inductors 2005 (formed of, for example, polysilicon, silicide, or metal lines), a first capacitor 2007, and a switched capacitor array 2009 set within the middle of the inductors. However, fewer structures or additional structures may also be utilized.

In an embodiment the first set of inductors 2003 are manufactured in order to provide (1−n)L/2 of the overall inductance for the digital controlled oscillators 1703. In an embodiment there may be two inductors of the first set of inductors 2003 provided in parallel with each other (but separated by the first capacitor 2007 and the switched capacitor array 2009), although any suitable number of individual inductors may be utilized.

The second set of inductors 2005 are manufactured in order to provide nL/2 of the overall inductance for the digital controlled oscillators 1703. In an embodiment there may be two inductors of the second set of inductors 2005 provided in parallel with each other (but separated by the switched capacitor array 2009). Additionally, individual ones of the second set of inductors 2005 are in series with individual ones of the first set of inductors 2003.

The first capacitor 2007 is connected between the second set of inductors 2005 and the active feedback device 130A. In an embodiment the first capacitor 2007 may have a capacitance of between about 0.1 pF and about 2 pF, such as about 1 pF. However, any suitable capacitance may be utilized. Additionally, the first capacitor 2007 is connected at a first node 2011 and a second node 2013 to the active feedback device 130A, and the first node and second node may also be connected to either the output transmission line or an output to another digital controlled oscillator.

The switched capacitor array 2009 is utilized to receive the signals from the decoder 1903 (in FIG. 19) and to modify the natural frequency of the digital controlled oscillator 1703 in which it is located. In an embodiment the switched capacitor array 2009 comprises a plurality of switch capacitors 2100 and is located in the middle of the first set of inductors 2003 and the second set of inductors 2005. However, any suitable location may be utilized.

Figure 21:
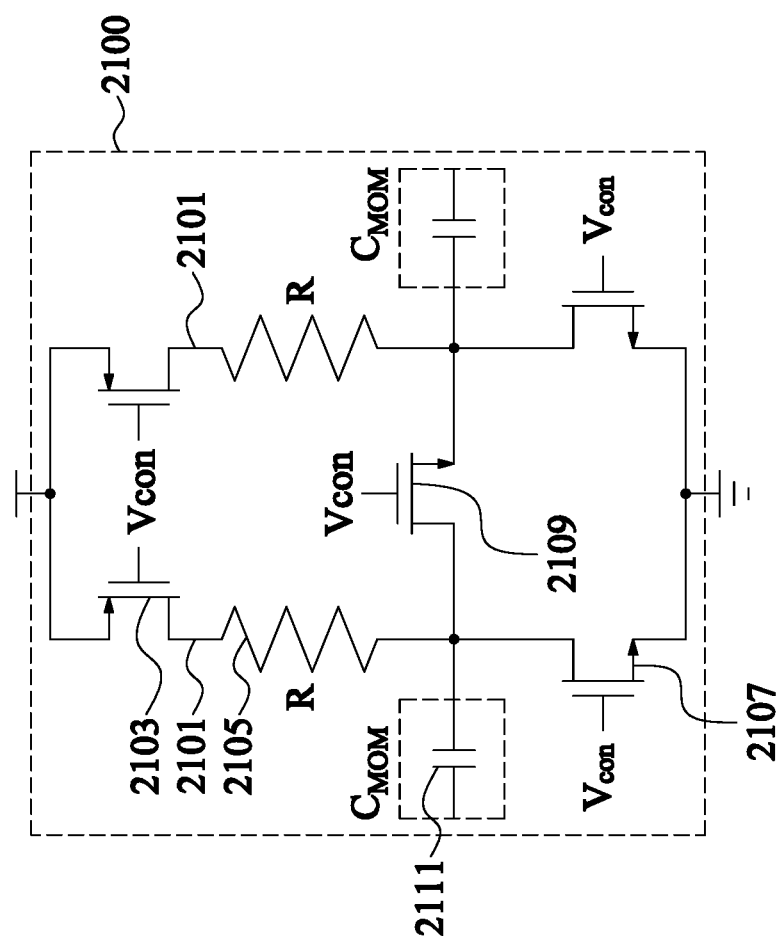
FIG. 21 is a switched capacitor in accordance with one or more embodiments.

FIG. 21 illustrates one embodiment of a structure formed using NMOS structures that may be utilized as one of the switch capacitors 2100 in the switched capacitor array 2009. In this embodiment two lines 2101 are connected between power and ground connectors, with each line 2101 comprises a first switch 2103, a resistor 2105 (with a resistance of between about 1 Kohm and about 100 Kohm), and a second switch 2107. A third switch 2109 is connected between the two lines 2101.

Also connected to each line is a second capacitor 2111. In an embodiment each of the second capacitors 2111 is a metal-oxide-metal capacitor, although any other suitable capacitor, such as a metal-insulator-metal capacitor, may also be used. The second capacitors 2111 may each have a capacitance between about 0.2 pF and about 4 pF, such as about 2 pF. However, any suitable capacitance may be utilized.

The second capacitors 2111 also act as the outputs from the switched capacitors 2100 to either other switched capacitors 2100 within the switched capacitor array 2009 or to the rest of the digital controlled oscillator 1703. For example, while one side of the second capacitors 2111 is connected to the lines 2101, the other side of the second capacitors 2111 is connected to external devices. However, any suitable connections may be utilized.

In operation, each of the first switch 2103, the second switch 2107, and the third switch 2109 are connected to the decoder 1903. In a particular embodiment, the decoder 1903 sends a control voltage ($V_{con}$) to the first switch 2103, the second switch 2107, and the third switch 2109 in order to turn on or turn off the individual switch capacitors 2100 within the switch capacitor array 2009. In an embodiment the control voltage $V_{con}$ may be less than about 1.8 V, such as about 0.8 V. However, any suitable voltage may be utilized.

Additionally, the switch capacitors 2100 illustrated in FIG. 21 is one of a plurality of switch capacitors 2100 within the switch capacitor array 2009 (see FIG. 20) of each of the digital controlled oscillators 1703. In an embodiment the switch capacitor array 2009 may comprise between 1 and 1000 switch capacitors 2100, such as about 100 switch capacitors 2100 within the switch capacitor array 2009. However, any suitable number of switch capacitors 2100 may be utilized. The decoder 1903 can turn individual ones of the switch capacitors 2100 within the switch capacitor array 2009 in order to tune the natural frequency and improve the frequency resolution of the individual digital controlled oscillators 1703.

Figure 22:
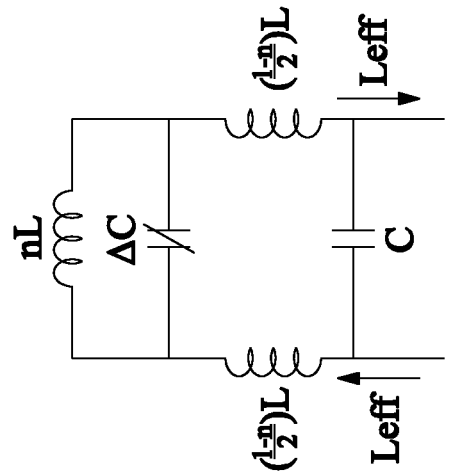
FIG. 22 is a model of the digital controlled oscillator in accordance with one or more embodiments.

FIG. 22 illustrates a model of the overall transformer including the digital controlled oscillators 1703 that may be utilized to illustrate the improvement in frequency resolution using embodiments. For example, a model of the digital controlled oscillator 1703 illustrated in FIG. 21 describes the equivalent inductance $L_{eq}$ approximated as illustrated in Equation 1:

$$L_{eq} = L + n^2 L \frac{C_{SC}}{C} \qquad \text{Equation 1}$$

Where L is the total inductance, C is the total capacitance, n is the number of switched capacitors 2100 in the switched capacitor array 2009 and $C_{SC}$ is the capacitance of the switch capacitor array 2009. With this model, the oscillation frequency of the digital controlled oscillator 1703 will be given by Equation 2:

$$\omega_{eq} = \frac{1}{\sqrt{L_{eq} \cdot C}} = \frac{1}{\sqrt{LC\left(1 + n^2 \frac{C_{SC}}{C}\right)}} \qquad \text{Equation 2}$$

As can be seen, the $C_{SC}$ is shrunk by $n^2$ times. For example, in an embodiment in which n=¼, the capacitor shrinking factor will be 16 and the frequency resolution is improved 16 times. The n in this equation may be between about ⅒ and about 1, such as about ¼.

By turning on or turning off individual ones of the switch capacitors 2100 within the switch capacitor array 2009, the decoder can modify and tune the natural frequency of individual ones of the digital controlled oscillators 1703 until the phase error $\Phi_{error}$ detected by the skew detector 1905 (see FIG. 19) between the first high frequency signal CKV and the second high frequency signal CKR is either eliminated or minimized. In particular, the equivalent capacitance of the switched capacitor array 2009 is modified as $V_{con}$ turns individual ones of the switch capacitors 2100 within the switched capacitor array 2009 on and off. This modification of the equivalent capacitance of the switched capacitor array 2009 can be used to control the frequency resolution of the overall digital controlled oscillator, with the resolution of the switch capacitor array 2009 being limited by the minimum value of the second capacitor 2111.

By modifying the equivalent capacitance of the switched capacitor array 2009, the natural frequency of the digital controlled oscillator 1703 may be modified. In particular, the decoder 1903 may control the digital controlled oscillator 1703 in order to modify the natural frequency in order to reduce or eliminate the phase error $\Phi_{error}$ between coupled ones of the digital controlled oscillators (see FIG. 19).

Figure 23:
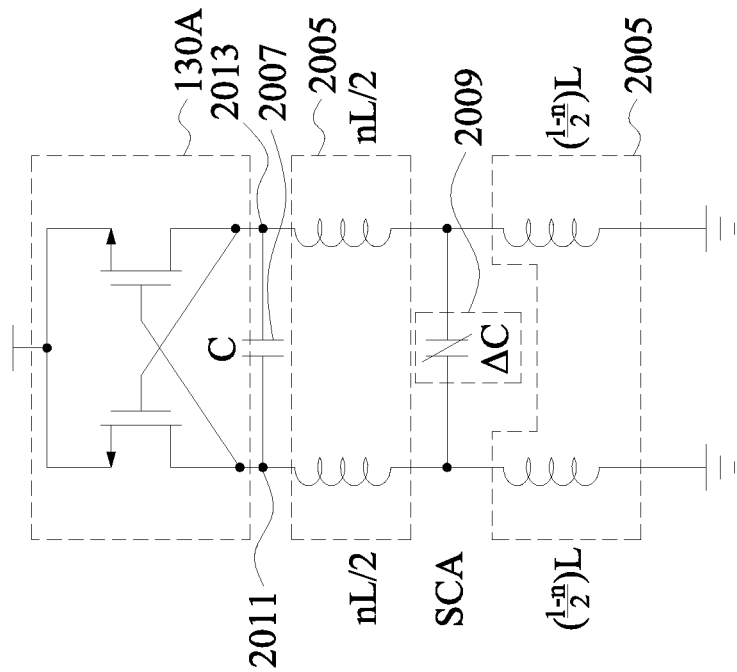
FIG. 23 is another digital controlled oscillator in accordance with one or more embodiments.

FIG. 23 illustrates another embodiment of a structure which may be used as the digital controlled oscillator 1703. In this embodiment the active feedback device 130A is connected to power, and the active feedback device may comprise a PMOS devices (instead of NMOS devices as described above with respect to FIG. 20). Additionally, the second set of inductors 2005 (with an inductance of nL/2) are connected to the active feedback device 130A, with the first set of inductors 2003 (with an inductance of (1−n)L/2) connecting the second set of inductors 2005 to ground.

Additionally, the first capacitor 2007 is connected between the second set of inductors 2005 and the active feedback device 130A, while the switched capacitor array 2009 is connected between the first set of inductors 2003 and the second set of inductors 2005.

Figure 24:
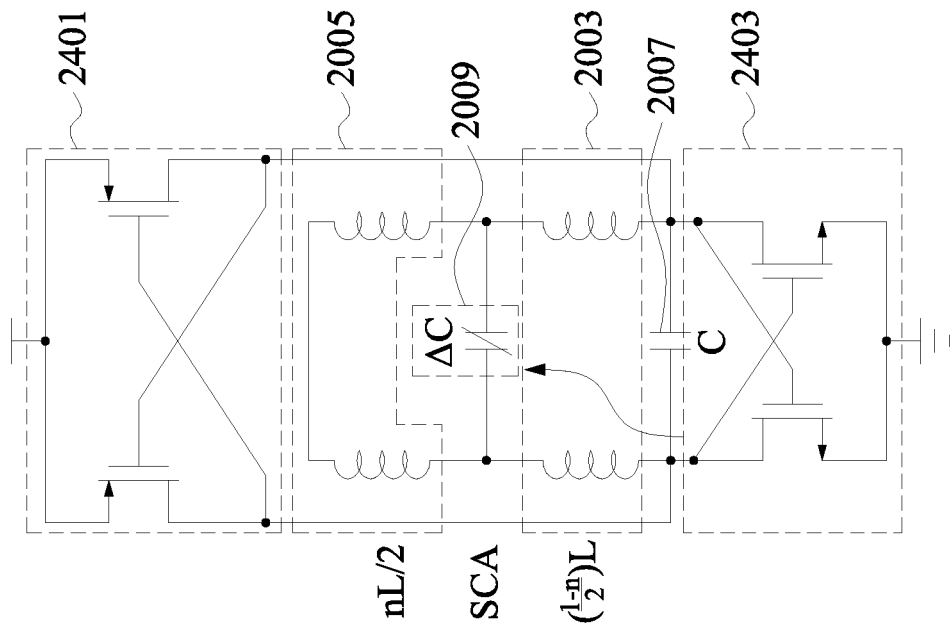
FIG. 24 is another digital controlled oscillator in accordance with one or more embodiments.

FIG. 24 illustrates yet another embodiment of a structure which may be used as the digital controlled oscillator 1703, but which uses both PMOS transistors and NMOS transistors. In this embodiment, a first active feedback device 2401 (comprising PMOS devices) is connected to power while a second active feedback device 2403 (comprising NMOS devices) is connected to ground. In an embodiment the first active feedback device 2401 and the second active feedback device 2403 may be similar to the active feedback device 130A described above with respect to FIG. 1, but with their respective devices as described herein.

Additionally in this embodiment, the first set of inductors 2003 (with an inductance of (1−n)L/2) is connected between the first active feedback device 2401 and the second active feedback device 2403. The second set of inductors 2005 is connected to the first set of inductors 2003, with individual ones of the second set of inductors 2005 being in series with individual ones of the first set of inductors 2003. Finally, the first capacitor 2007 is connected between the first set of inductors 2003 and the second active feedback device 2403 while the switch capacitor array 2009 is connected between the first set of inductors 2003 and the second set of inductors 2005. However, any suitable arrangement of structures may be utilized.

By having multiple configurations which may be used for different types of processes (CMOS, NMOS, PMOS), there is greater design flexibility. For example, the specific design of the digital controlled oscillator 1703 may be chosen for an easy incorporation into the overall design processes. Such flexibility makes the overall design easier to generate.

In accordance with one embodiment, a circuit includes a coupling structure and a first inductive device. The coupling structure includes two or more conductive loops and a set of conductive paths electrically connecting the two or more conductive loops. The first inductive device is magnetically coupled with a first conductive loop of the two or more conductive loops.

In accordance with another embodiment, a circuit includes a first oscillator comprising an inductive device, a second oscillator comprising an inductive device, and a coupling structure. The coupling structure includes a first conductive loop magnetically coupled with the inductive device of the first oscillator, a second conductive loop magnetically coupled with the inductive device of the second oscillator, and a set of conductive paths electrically connecting the first conductive loop and the second conductive loop.

In accordance with another embodiment, a method includes generating an induced current at a first conductive loop of a coupling structure responsive to a first magnetic field generated by a first inductive device of a first oscillator. The induced current is transmitted to a second conductive loop of the coupling structure through a set of conductive paths of the coupling structure electrically connecting the first and second conductive loops. A second inductive device of a second oscillator is magnetically coupled with the first inductive device of the first oscillator through the coupling structure.

In accordance with yet another embodiment, a integrated circuit device comprising a first digital controlled oscillator and a second digital controlled oscillator coupled to the first digital controlled oscillator is provided. A skew detector is connected to outputs of both the first digital controlled oscillator and the second digital controlled oscillator, and a decoder connected to an output of the skew detector, wherein an output from the decoder is connected to a switch capacitor array within the first digital controlled oscillator.

In accordance with another embodiment, a integrated circuit device comprising a first digital controlled oscillator is provided. The first digital controlled oscillator comprises a first set of inductors, each one of the first set of inductors having a first inductance, and a second set of inductors, each one of the second set of inductors having a second inductance different from the first inductance, wherein individual ones of the first set of inductors are in series with individual ones of the second set of inductors. A switched capacitor array is connected between the first set of inductors and the second set of inductors, and an active feedback device is connected to one of the first set of inductors or the second set of inductors. A second digital controlled oscillator is coupled to the first digital controlled oscillator.

In accordance with yet another embodiment, a method comprising determining a first skew between a first clock signal and a second clock signal, the first clock signal originating from a first digital controlled oscillator, the second clock signal originating from a second digital controlled oscillator coupled to the first digital controlled oscillator is provided. A natural frequency of the first digital controlled oscillator is modified by sending a signal to a switched capacitor array within the first digital controlled oscillator, the signal being based on the first skew.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device comprising:
 a first digital controlled oscillator, wherein the first digital controlled oscillator comprises:
  a first set of inductors, each one of the first set of inductors having a first inductance;
  a second set of inductors, each one of the second set of inductors having a second inductance different from the first inductance, wherein individual ones of the first set of inductors are in series with individual ones of the second set of inductors;
  a switched capacitor array connected between the first set of inductors and the second set of inductors;
  a first active feedback device connected to the first set of inductors;
  a second active feedback device connected to the first set of inductors; and
  a capacitor connected between a first inductor of the first set of inductors and a second inductor of the first set of inductors, the capacitor having a constant capacitance; and
 a second digital controlled oscillator coupled to the first digital controlled oscillator.

2. The integrated circuit device of claim 1, wherein the first active feedback device is connected between a ground and the first set of inductors.

3. The integrated circuit device of claim 1, wherein the first active feedback device is connected between a power and the first set of inductors.

4. The integrated circuit device of claim 1, wherein the first active feedback device is connected to power and the second active feedback device is connected to ground.

5. The integrated circuit device of claim 4, wherein the first active feedback device comprises PMOS devices and the second active feedback device comprises NMOS devices.

6. The integrated circuit device of claim 1, wherein the first active feedback device comprises PMOS devices.

7. The integrated circuit device of claim 1, wherein first the active feedback device comprises NMOS devices.

8. An integrated circuit device comprising:
a first digital controlled oscillator, the first digital controlled oscillator comprising:
a first set of inductors, each inductor of the first set of inductors having a first inductance;
a second set of inductors, each inductor of the second set of inductors having a second inductance different from the first inductance;
a switched capacitor array connected between the first set of inductors and the second set of inductors;
a first active feedback device connected between one of the first set of inductors or the second set of inductors and a ground node, the first active feedback device comprising NMOS devices, wherein a connection between the first active feedback device and the one of the first set of inductors or the second set of inductors has a constant capacitance; and
a second active feedback device connected between the one of the first set of inductors or the second set of inductors and a power node;
a second digital controlled oscillator coupled to the first digital controlled oscillator.

9. The integrated circuit device of claim 8, wherein individual inductors of the first set of inductors are in series with individual inductors of the second set of inductors.

10. The integrated circuit device of claim 8, wherein each inductor of the one of the first set of inductors or the second set of inductors is connected in parallel, and wherein each inductor of the other of the first set of inductors or the second set of inductors is connected in series.

11. The integrated circuit device of claim 8, wherein the switched capacitor array comprises a switched capacitor, the switched capacitor comprising:
a first line comprising a first switch, a first resistor, and a second switch in series;
a second line comprising a third switch, a second resistor, and a fourth switch, the second line in parallel with the first line;
a fifth switch connected to the first line at a first node and connected to the second line at a second node;
a first capacitor connected to the first node; and
a second capacitor connected to the second node.

12. The integrated circuit device of claim 11, wherein the first switch, the second switch, the third switch, the fourth switch, and the fifth switch each have a gate electrically connected to a control voltage.

13. The integrated circuit device of claim 8, wherein the first digital controlled oscillator is coupled to the second digital controlled oscillator through a magnetic field.

14. The integrated circuit device of claim 8, wherein the second active feedback device comprises PMOS devices.

15. An integrated circuit device comprising:
a first digital controlled oscillator comprising:
a first inductor;
a second inductor having a different inductance than the first inductor;
a switched capacitor array coupled between the first inductor and the second inductor;
a first active feedback device, wherein the first inductor is coupled between the switched capacitor array and the first active feedback device;
a second active feedback device, wherein the first inductor is coupled between the switched capacitor array and the second active feedback device; and
a fixed capacitor, wherein the first inductor is coupled between the switched capacitor array and the fixed capacitor.

16. The integrated circuit device of claim 15, wherein the switched capacitor array comprises a plurality of switched capacitors, each one of the plurality of switched capacitors comprising:
a first line comprising a first switch, a first resistor, and a second switch in series;
a second line comprising a third switch, a second resistor, and a fourth switch, the second line in parallel with the first line;
a fifth switch connected to the first line at a first node and connected to the second line at a second node;
a first capacitor connected to the first node; and
a second capacitor connected to the second node.

17. The integrated circuit device of claim 15, further comprising a third inductor coupled to the second inductor in series, the third inductor having a same inductance as the second inductor.

18. The integrated circuit device of claim 17, further comprising a fourth inductor coupled to the first inductor in parallel, the fourth inductor having a same inductance as the first inductor.

19. The integrated circuit device of claim 15, wherein one of the first active feedback device or the second active feedback device is connected to ground and the other of the first active feedback device or the second active feedback device is connected to power.

20. The integrated circuit device of claim 15, wherein one of the first active feedback device or the second active feedback device comprises PMOS transistors and the other of the first active feedback device or the second active feedback device comprises NMOS transistors.

* * * * *